(12) United States Patent
Mori

(10) Patent No.: US 11,573,613 B2
(45) Date of Patent: Feb. 7, 2023

(54) DISPLAY MODULE GROUP, DISPLAY DEVICE, AND DISPLAY DEVICE PRODUCTION METHOD

(71) Applicant: Mitsubishi Electric Corporation, Tokyo (JP)

(72) Inventor: Yoshinosuke Mori, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 503 days.

(21) Appl. No.: 16/612,063

(22) PCT Filed: May 22, 2017

(86) PCT No.: PCT/JP2017/018977
§ 371 (c)(1),
(2) Date: Nov. 8, 2019

(87) PCT Pub. No.: WO2018/216055
PCT Pub. Date: Nov. 29, 2018

(65) Prior Publication Data
US 2021/0157371 A1    May 27, 2021

(51) Int. Cl.
*G06F 1/18*     (2006.01)
*H05K 5/00*     (2006.01)
*G09F 9/302*    (2006.01)

(52) U.S. Cl.
CPC ............ *G06F 1/181* (2013.01); *G09F 9/3026* (2013.01); *H05K 5/0052* (2013.01)

(58) Field of Classification Search
CPC ...... G06F 1/181; G06F 1/1601; G09F 9/3026; H05K 5/0052
See application file for complete search history.

(56) References Cited

U.S. PATENT DOCUMENTS 5,246,194 A * 9/1993 Garcia ..................... G09F 7/18
52/764
5,390,093 A * 2/1995 Himeno ............... F21V 29/505
362/249.11

(Continued)

FOREIGN PATENT DOCUMENTS

CN    101937630 A  *  1/2011
CN    101937630 A      1/2011

(Continued)

OTHER PUBLICATIONS

Office Action dated Jan. 28, 2021 issued in corresponding Chinese Patent Application No. 201780090863.4, with English translation (41 pages).

(Continued)

*Primary Examiner* — Rockshana D Chowdhury
(74) *Attorney, Agent, or Firm* — Buchanan Ingersoll & Rooney PC

(57) ABSTRACT

At least one first display module selected from display modules arranged in a matrix to form a display screen for displaying an image has a first screw hole into which a first screw is screwed with the first screw pressed against a second display module placed adjacent to the first display module in forming the display screen. The first display module has a through-hole. The second display module has a second screw hole into which a second screw is screwed after the second screw is put through the through-hole toward the second display module. The second screw includes a shank having an outer diameter smaller than an inner diameter of the through-hole and a head having an outer diameter greater than the inner diameter of the through-hole.

8 Claims, 18 Drawing Sheets

(56) References Cited

U.S. PATENT DOCUMENTS

| | | | | |
|---|---|---|---|---|
| 5,914,698 | A * | 6/1999 | Nicholson | G09F 9/33 345/1.3 |
| 6,168,215 | B1 | 1/2001 | Kodama et al. | |
| 6,314,669 | B1 * | 11/2001 | Tucker | G09F 9/3026 345/82 |
| 6,729,054 | B1 * | 5/2004 | VanderTuin | G09F 9/3026 16/236 |
| 6,741,222 | B1 * | 5/2004 | Tucker | G09F 9/33 345/1.1 |
| 6,789,921 | B1 * | 9/2004 | Deloy | G02F 1/133603 362/555 |
| 6,813,853 | B1 * | 11/2004 | Tucker | G09F 9/33 345/82 |
| 7,926,213 | B1 * | 4/2011 | Kludt | H05K 5/0204 40/605 |
| 9,416,551 | B2 * | 8/2016 | Hall | G09F 21/04 |
| 9,845,816 | B2 * | 12/2017 | Brashnyk | F16B 5/02 |
| 10,690,158 | B2 * | 6/2020 | Messmore | F16B 5/0064 |
| 11,023,195 | B2 * | 6/2021 | Kwon | G02F 1/1333 |
| 11,184,986 | B2 * | 11/2021 | Heo | H05K 5/0008 |
| 11,335,219 | B2 * | 5/2022 | Kim | G02F 1/13336 |
| 2011/0315837 | A1 | 12/2011 | Mitsuhashi | |
| 2015/0016034 | A1 * | 1/2015 | Kludt | H05K 5/0204 361/679.01 |
| 2015/0276120 | A1 | 10/2015 | Shibata | |
| 2016/0010836 | A1 * | 1/2016 | Patterson | G09F 9/33 40/541 |
| 2016/0161792 | A1 * | 6/2016 | Du | G02F 1/133308 349/58 |
| 2019/0239364 | A1 * | 8/2019 | Heo | H05K 5/03 |
| 2020/0068726 | A1 * | 2/2020 | Hwang | H05K 5/0221 |
| 2020/0401184 | A1 * | 12/2020 | Saito | G06F 1/1601 |
| 2021/0072788 | A1 * | 3/2021 | Kim | G06F 1/1611 |
| 2021/0076115 | A1 * | 3/2021 | Choi | H04R 1/028 |
| 2021/0259118 | A1 * | 8/2021 | Drabant | F21V 19/00 |
| 2021/0311347 | A1 * | 10/2021 | Ono | G02F 1/13338 |
| 2021/0392764 | A1 * | 12/2021 | Kim | H05K 5/0017 |
| 2022/0058988 | A1 * | 2/2022 | Su | G09F 9/3026 |
| 2022/0122491 | A1 * | 4/2022 | Li | A47F 1/12 |

FOREIGN PATENT DOCUMENTS

| | | |
|---|---|---|
| CN | 103925982 A | 7/2014 |
| JP | 2000017923 A | 1/2000 |
| JP | 2000338899 A | 12/2000 |
| JP | 2001065246 A | 3/2001 |
| JP | 2004100940 A | 4/2004 |
| JP | 2009237511 A | 10/2009 |
| JP | 2015194516 A | 11/2015 |
| WO | 2010116502 A1 | 10/2010 |

OTHER PUBLICATIONS

International Search Report (with English translation) and Written Opinion issued in corresponding International Patent Application No. PCT/JP2017/018977, 11 pages (dated Aug. 8, 2017).

Office Action dated Sep. 3, 2021, in corresponding Chinese Patent Application No. 201780090863.4 and English translation of the Office Action (26 pages).

Office Action dated Mar. 10, 2020, issued in corresponding Japanese Patent Application No. 2019-519802, 9 pages including 4 pages of English translation.

* cited by examiner

DISPLAY MODULE GROUP, DISPLAY DEVICE, AND DISPLAY DEVICE PRODUCTION METHOD

TECHNICAL FIELD

The present disclosure relates to a display module group, a display device, and a display device production method.

BACKGROUND ART

As disclosed in Patent Literature 1, known display devices include a display device including display modules connected together in a matrix and each configured to display an image. The display modules are connected to one another to form a single display screen as a whole.

CITATION LIST

Patent Literature

Patent Literature 1: Unexamined Japanese Patent Application Kokai Publication No. 2009-237511

SUMMARY OF INVENTION

Technical Problem

Patent Literature 1 describing a technique for connecting the display modules together does not describe a technique for adjusting the spacing between the connected display modules.

However, when the spacing between adjacent display modules deviates from a preset proper design value, the boundary between the display modules becomes conspicuous in the image displayed on the display screen. The spacing between adjacent display modules is to be adjusted in the process of connecting the display modules together.

When the display modules are shifted to adjust the spacing, the display modules can gain momentum to excessively move. Accordingly, finely adjusting the spacing between adjacent display modules to make the boundary inconspicuous is difficult and time consuming.

In consideration of the aforementioned circumstances, an objective of the present disclosure is to provide a display module group, a display device, and a display device production method that facilitate adjustment of the spacing between adjacent display modules.

Solution to Problem

In order to attain the aforementioned object, a display module group according to the present disclosure includes display modules that are arranged in a matrix to form a display screen for displaying an image. At least one first display module selected from among the display modules has a first screw hole into which a first screw is screwed with the first screw pressed against a second display module among the display modules in forming the display screen, the second display module being placed adjacent to the first display module. One display module of the first display module and the second display module has a through-hole, and the other display module of the first display module and the second display module has a second screw hole into which a second screw is screwed after the second screw is put through the through-hole and toward the other display module. The second screw includes a shank having an outer diameter smaller than an inner diameter of the through-hole and a head having an outer diameter greater than the inner diameter of the through-hole.

Advantageous Effects of Invention

In the display module group according to the above aspect, when the first screw is screwed into the first screw hole, the spacing between the first display module and the second display module can be increased by the distance corresponding to the rotation angle of the first screw. Further, when the second screw is inserted into the through-hole and then is screwed into the second screw hole, the spacing between the first display module and the second display module is decreased by the distance corresponding to the rotation angle of the second screw. This structure facilitates adjustment of the spacing between adjacent display modules.

DESCRIPTION OF EMBODIMENTS

Figure 1:
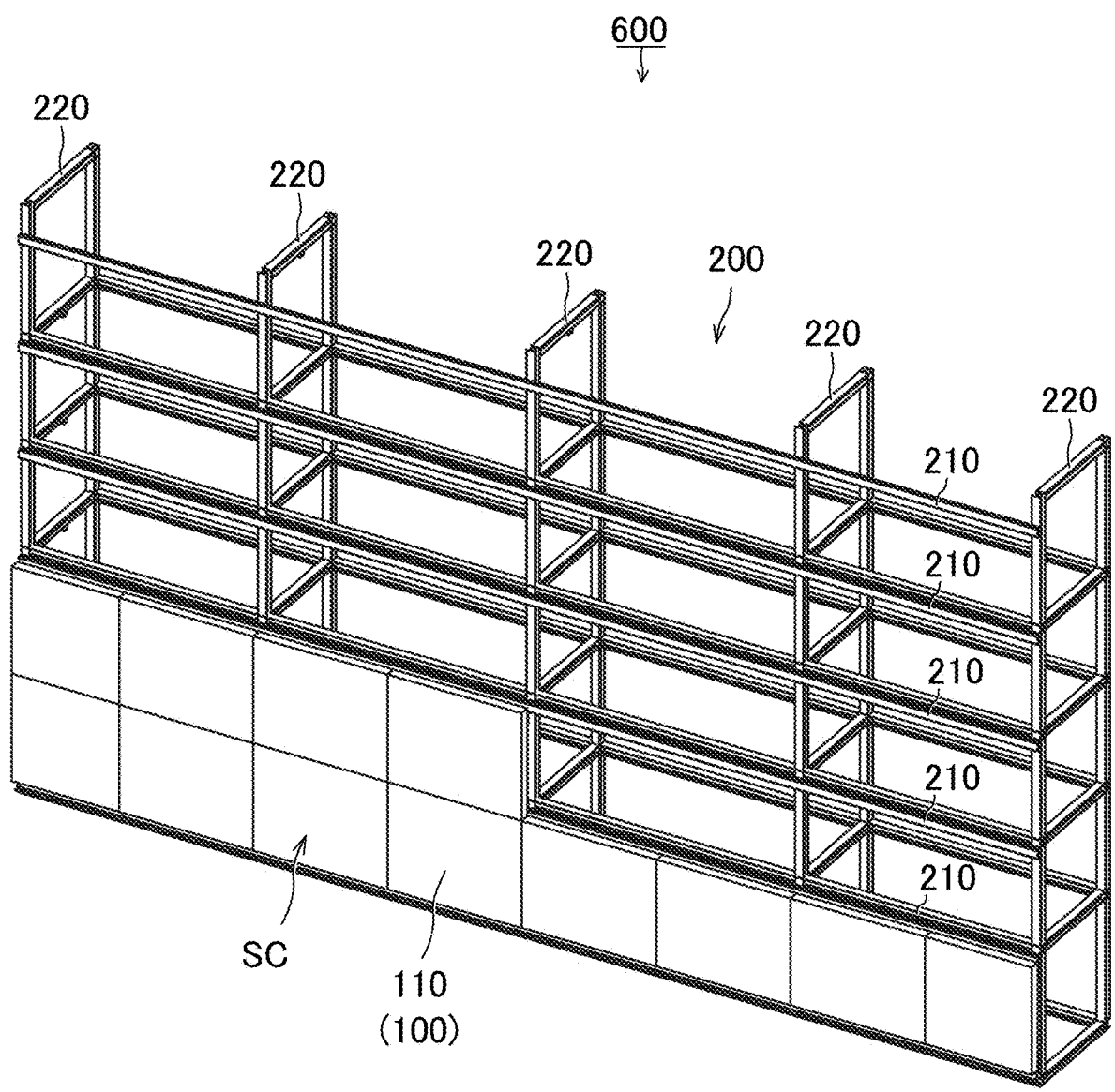
FIG. 1 is a partial perspective view of a display device according to Embodiment 1.

A display module group, a display device, and a display device production method according to embodiments of the present disclosure are described blow with reference to the drawings. In the drawings, the same or corresponding components are given the same reference sign.

Embodiment 1

As shown in FIG. 1, a display device 600 according to the present embodiment includes a display module group 100 including display modules 110 to each display an image, and a frame 200 supporting the display module group 100. In FIG. 1, in order to clearly illustrate the structure of the frame 200, only some of the display modules 110 in the display module group 100 are illustrated. When all the display modules 110 are arranged in a matrix in the frame 200, the display module group 100 forms a single display screen SC as a whole.

For ease of understanding, the orthogonal XYZ coordinate system is defined under the condition that the display screen SC is installed vertically on the ground. X-axis is parallel to the right-left direction of the display screen SC as viewed from the front of the screen SC. The right direction of X-axis is a positive direction. Y-axis is parallel to the up-down direction of the display screen SC as viewed from the front of the screen SC. The up direction is a positive direction of Y-axis. Z-axis is parallel to the thickness direction of the display device 600. The direction from the rear surface toward the display screen SC is a positive direction of Z-axis.

The orthogonal XYZ coordinate system is also defined for each component included in the display device 600. In the below-described description, the directional terms for the components of the display device 600, upper, lower, left, right, front, and rear respectively mean a positive Y-direction, a negative Y-direction, a negative X-direction, a positive X-direction, a positive Z-direction, and a negative Z-direction independently of the postures of the components.

As shown in FIG. 1, each display module 110 included in the display module group 100 is rectangular having one side that is parallel to X-axis, as viewed from the front along Z-axis. The matrix formed by the display module group 100 in the frame 200 includes rows parallel to X-axis and columns parallel to Y-axis.

Figure 2:
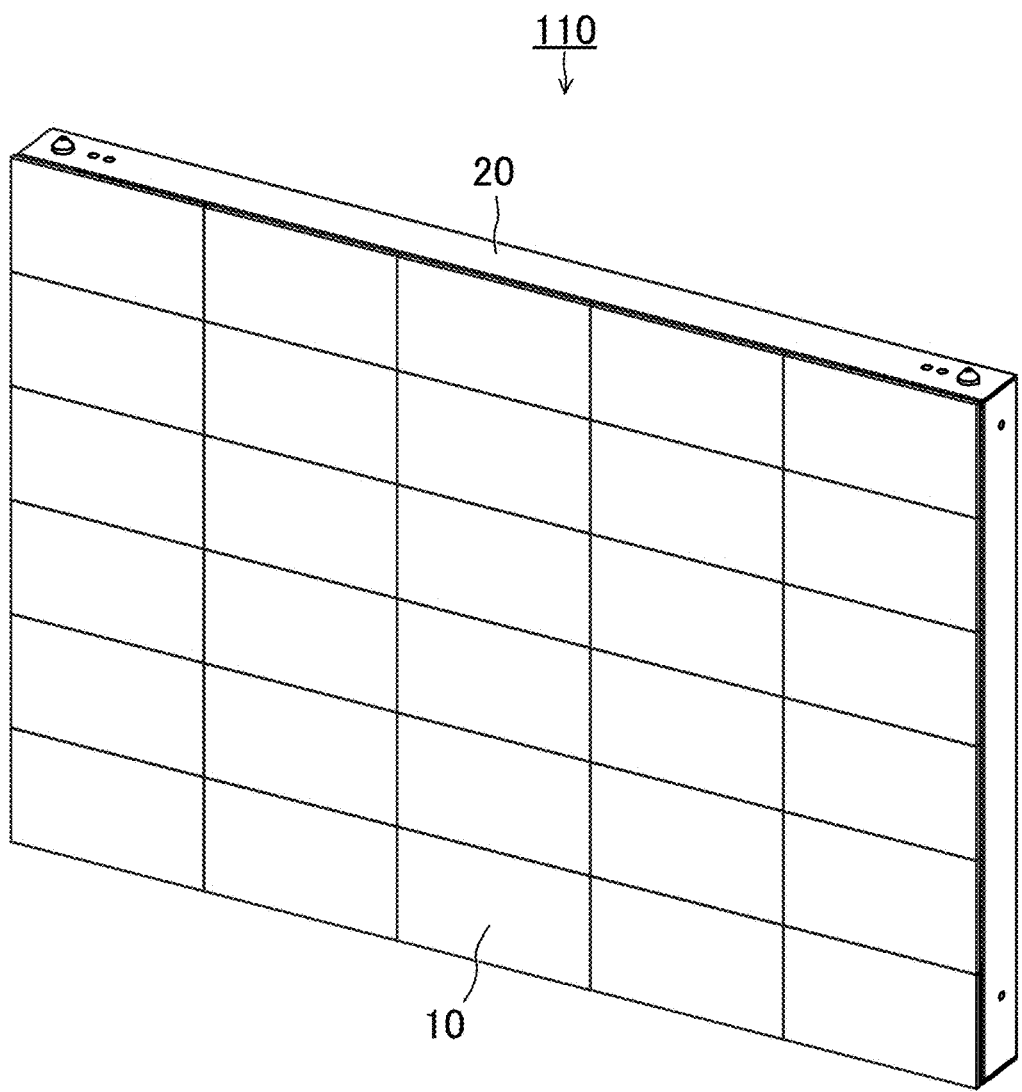
FIG. 2 is a front perspective view of a display module according to Embodiment 1.

As shown in FIG. 2, each display module 110 includes display units 10 arranged in a matrix and a housing 20 retaining the display units 10. The matrix formed by the display units 10 in the housing 20 includes rows parallel to X-axis and columns parallel to Y-axis.

Figure 6:
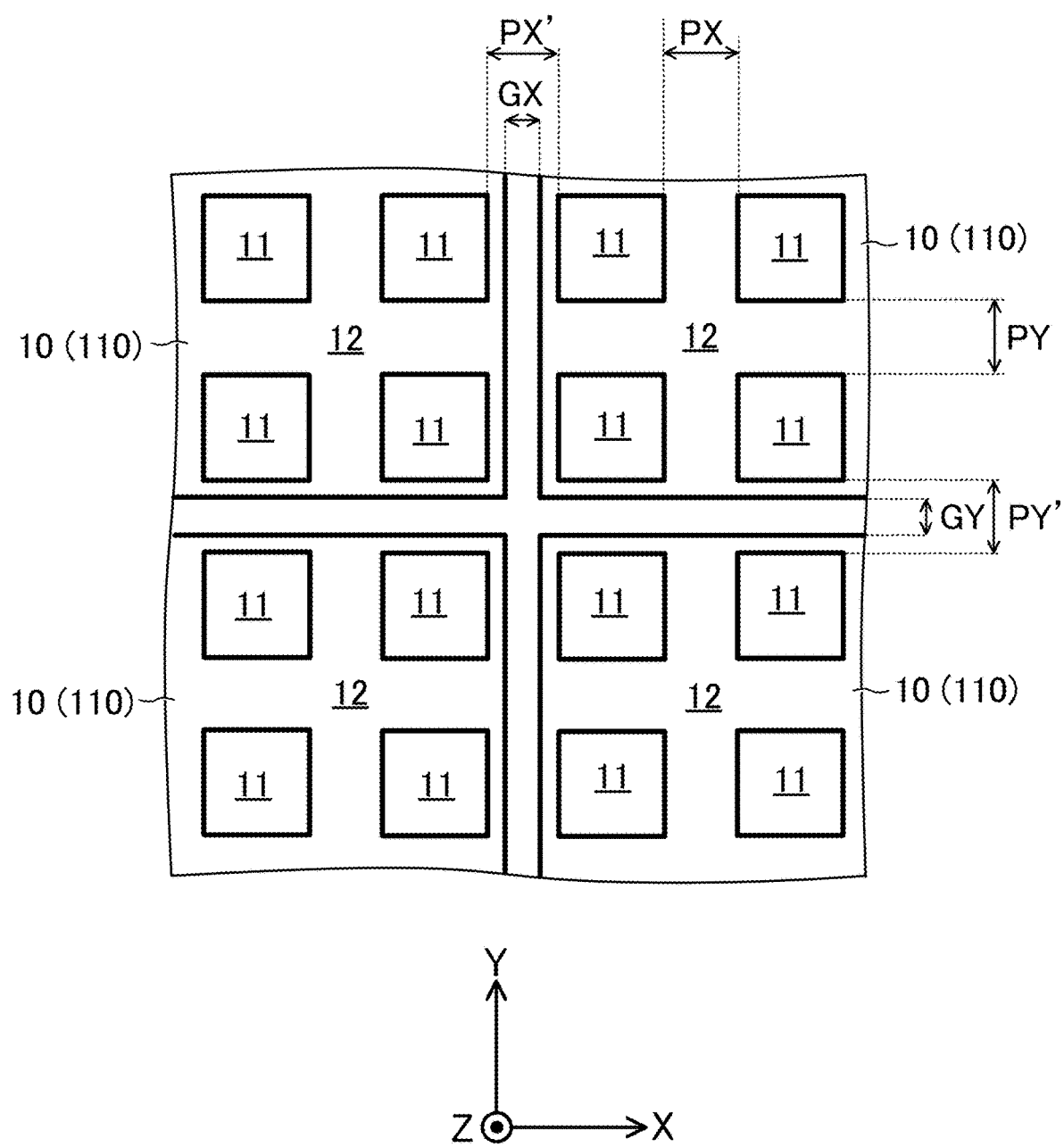
FIG. 6 is an enlarged partial front view of the display device according to Embodiment 1.

As shown in FIG. 6, each display unit 10 includes a plurality of light emitting devices 11 configured to emit visible light and a circuit board 12 on which the light emitting devices 11 are mounted. Each light emitting device 11 includes a light emitting diode (LED) chip contained in a package.

Referring back to FIG. 1, the frame 200 in which the display module group 100 is arranged in X- and Y-directions in a matrix includes beams 210 extending in X-direction and post structures 220 extending in Y-direction. Each beam 210 extends from one end to the other end of the display device 600 in X-direction. Each post structure 220 extends from one end to the other end of the display device 600 in Y-direction.

The post structures 220 are spaced from one another in X-direction. The beams 210 are spaced from one another in Y-direction on the front surfaces of the post structures 220. In other words, the beams 210 and the post structures 220 are connected with each other in a grid as viewed from the front along Z-axis, thereby forming the frame 200.

Figure 4:
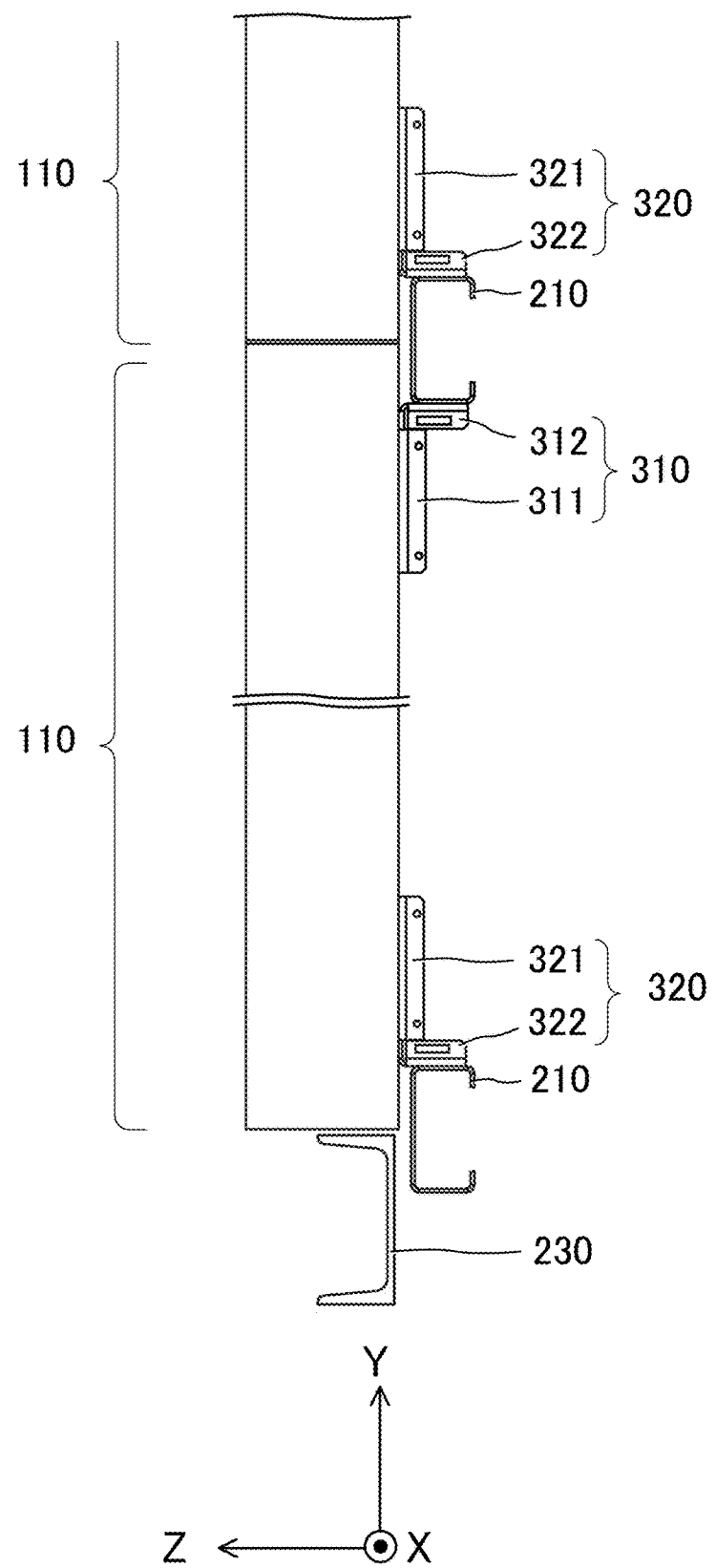
FIG. 4 is a partial right side view of the display device according to Embodiment 1.

As shown in FIG. 4, each beam 210 is made of a steel lip channel having a C-shape on the YZ plane. As shown in FIG. 4, the frame 200 also includes a base member 230 made of a steel channel. Display modules 110 located in the bottom row of the matrix formed by the display module group 100 are placed on the base member 230. The base member 230 extends from one end to the other end of the display device 600 in X-direction.

The display modules 110 are mounted onto the frame 200 with the above structure. The structure for mounting the display modules 110 to the beams 210 in the frame 200 is described below.

Figure 3:
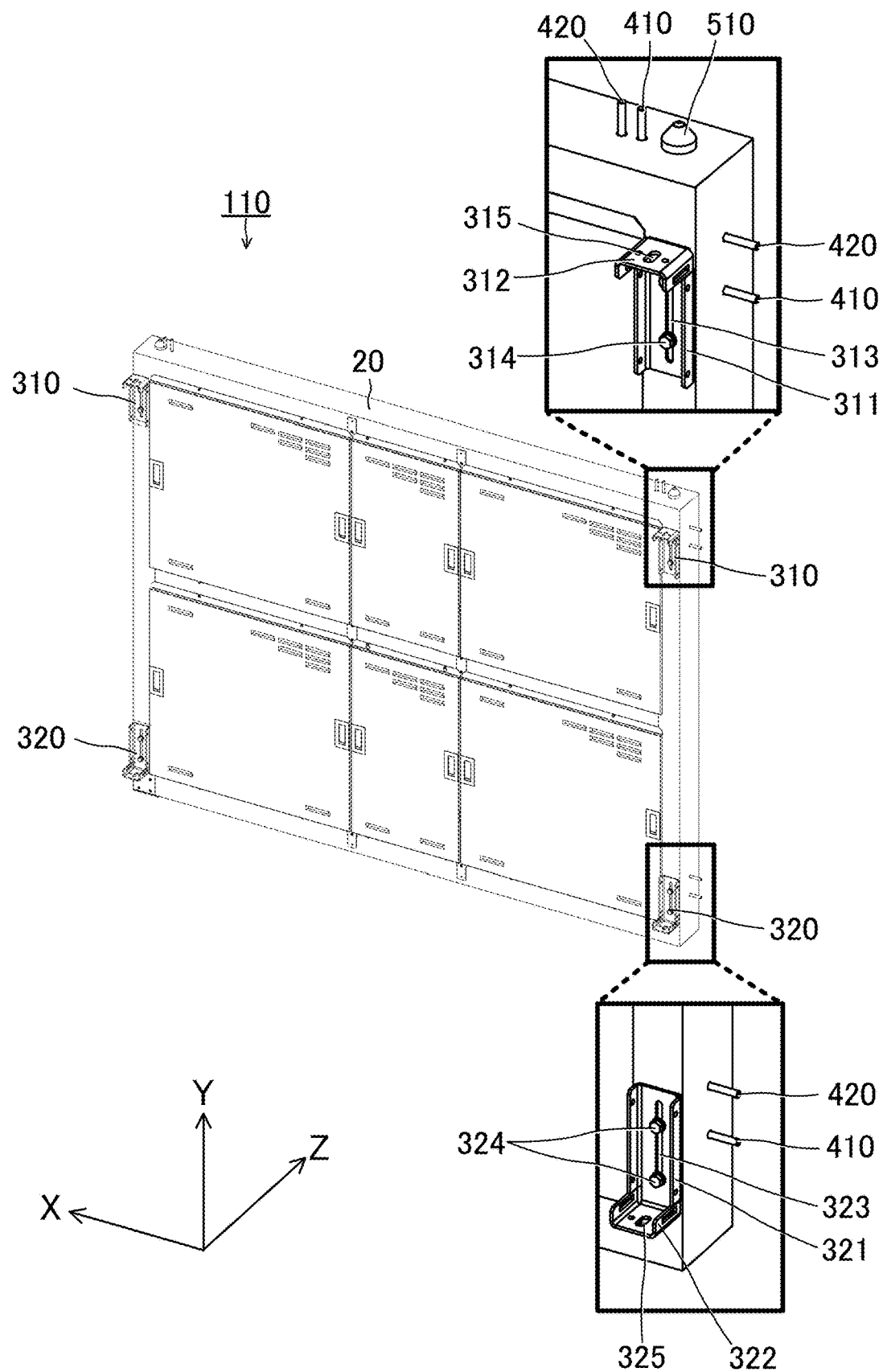
FIG. 3 is a rear perspective view of the display module according to Embodiment 1.

As shown in FIG. 3, each display module 110 includes, on the rear surface opposite to the display screen SC, first brackets 310 and second brackets 320 as fixtures for fixing the display module 110 to the beams 210 shown in FIG. 1.

The first brackets 310 are disposed at upper two of the four corners on the rear surface of the display module 110. Each first bracket 310 is an L-shaped angle member including a base 311 extending in Y-direction along the housing 20 and a protrusion 312 protruding rearward from the upper end of the base 311.

The base 311 has a Y-slot 313 elongated in Y-direction. Bolts 314 are inserted through the Y-slot 313 and screwed into nuts (not shown) arranged inside the housing 20 to fix the base 311 to the housing 20. The Y-slot 313 elongated in Y-direction allows adjustment of the fixing position of the first bracket 310 in Y-direction relative to the housing 20.

The protrusion 312 has a Z-slot 315 elongated in Z-direction. A bolt is inserted through the Z-slot 315 to fix the protrusion 312 to the beam 210 shown in FIG. 1.

The second brackets 320 are disposed at lower two of the four corners on the rear surface of the display module 110. Each second bracket 320 is an L-shaped angle member including a base 321 extending in Y-direction along the housing 20 and a protrusion 322 protruding rearward from the lower end of the base 321.

The base 321 has a Y-slot 323 elongated in Y-direction. Bolts 324 are inserted through the Y-slot 323 and screwed into nuts (not shown) arranged inside the housing 20 to fix the base 321 to the housing 20. The Y-slot 323 elongated in Y-direction allows adjustment of the fixing position of the second bracket 320 in Y-direction relative to the housing 20.

The protrusion 322 has a Z-slot 325 elongated in Z-direction. A bolt is inserted through the Z-slot 325 to fix the protrusion 322 to the beam 210 shown in FIG. 1.

Attachment of the protrusion 312 of the first bracket 310 and the protrusion 322 of the second bracket 320 to the corresponding beams 210 shown in FIG. 1 is described below in detail.

As shown in FIG. 4, the protrusion 312 of the first bracket 310 and the protrusion 322 of the second bracket 320 are in surface contact with the corresponding beams 210. More specifically, one display module 110 has the protrusion 312 of the first bracket 310 that makes surface contact with the lower surface of the corresponding beam 210 and the protrusion 322 of the second bracket 320 that makes surface contact with the upper surface of the lower beam 210.

The protrusion 312 of the first bracket 310 and the protrusion 322 of the second bracket 320 are attached to the corresponding beams 210 in the same manner. Attachment of the protrusion 322 is described below in detail as a typical example.

Figure 5:
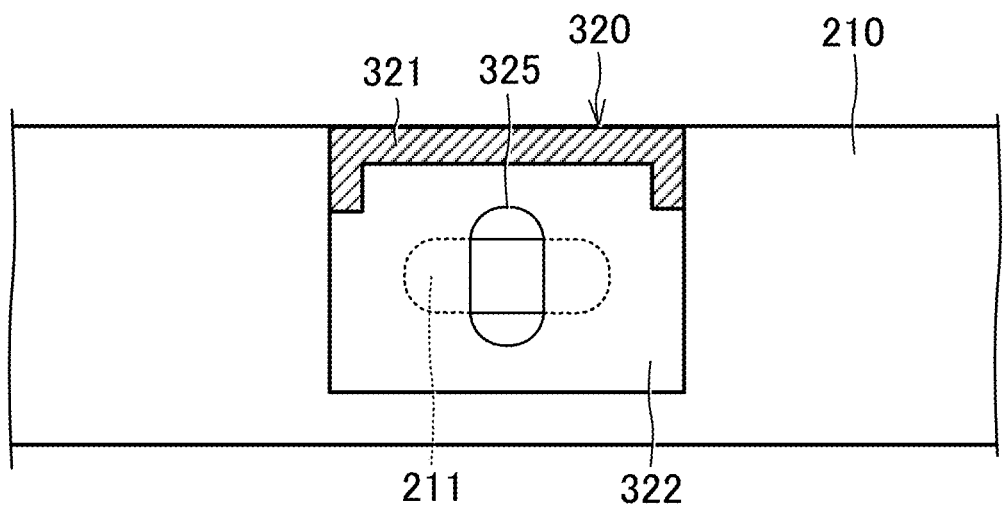
FIG. 5 is a partial cross-sectional plan view of a second bracket according to Embodiment 1.
Figure 5:
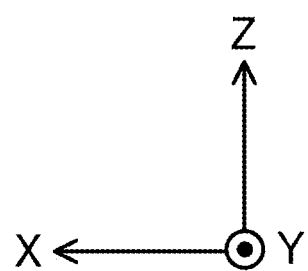

As shown in FIG. 5, the upper surface of the beam 210 has an X-slot 211 elongated in X-direction in a portion of the upper surface that makes surface contact with the protrusion 322 of the second bracket 320. The X-slot 211 intersects with the Z-slot 325 of the protrusion 322. A bolt (not shown)

is inserted through the intersection and screwed into a nut (not shown) arranged inside the beam 210 to fix the protrusion 322 to the beam 210.

Although not shown, the lower surface of the beam 210 also has an X-slot 211 in a portion of the lower surface that makes surface contact with the protrusion 312 of the first bracket 310 shown in FIGS. 3 and 4 and the X-slot 211 intersects with the Z-slot 315 shown in FIG. 3. A bolt is screwed into a nut at the intersection between the Z-slot 315 and the X-slot 211 to fix the protrusion 312 of the first bracket 310 to the beam 210.

The X-slot 211 elongated in X-direction allows adjustment of the position of the display module 110 in X-direction relative to the beam 210. The Z-slots 315 and 325 shown in FIG. 3 elongated in Z-direction allow adjustment of the position of the display module 110 in Z-direction relative to the beams 210. The Y-slot 313 shown in FIG. 3 elongated in Y-direction allows adjustment of the position of the display module 110 in Y-direction relative to the beam 210.

In other words, the first bracket 310 and the second bracket 320 can each temporarily fasten the display module 110 to the beams 210 in a manner tolerating shifting of the display module 110 in any three-dimensional directions. After the display module 110 is positioned relative to the beams 210, the bolts and the nuts (not shown) connecting the first bracket 310 and the second bracket 320 to the beams 210 are tightened. This fixes the display module 110 to the beams 210.

Using the first brackets 310 and the second brackets 320 described above, the display module group 100 is mounted onto the frame 200 in a way that arranges the display modules in a matrix as shown in FIG. 1. In the arrangement process, the spacing between adjacent display modules 110 is to be adjusted by using the temporary fastening function of the first brackets 310 and the second brackets 320 described above. The reason for the adjustment is described below with reference to FIG. 6.

FIG. 6 is an enlarged view of an area of the display screen SC shown in FIG. 1 in which corners of four display modules 110 are located near one another. In each display module 110, the light emitting devices 11 are arranged on the circuit board 12 with a pitch PX in X-direction and a pitch PY in Y-direction.

If a spacing GX in X-direction between display modules 110 adjacent to each other in X-direction deviates from a preset design value, a spacing PX' in X-direction between a light emitting device 11 in one display module 110 of these display modules 110 nearest the other display module 110 and a light emitting device 11 in the other display module 110 nearest the display module 110 can deviate from the pitch PX.

This causes the boundary between the display modules 110 adjacent to each other in X-direction to appear visible in the image displayed on the display screen SC shown in FIG. 1. In other words, the spacing PX' different from the pitch PX can cause the user to view the linear boundary extending in Y-direction.

In the same manner, if the spacing GY in Y-direction between display modules 110 adjacent to each other in Y-direction deviates from a preset design value, the spacing PY' in Y-direction between a light emitting device 11 in one display module 110 of these display modules 110 nearest the other display module 110 and a light emitting device 11 in the other display module 110 nearest the display module 110 can deviate from the pitch PY.

This causes the boundary between the display modules 110 adjacent to each other in Y-direction to appear visible in the image displayed on the display screen SC shown in FIG. 1. In other words, the spacing PY' different from the pitch PY can cause the user to view the linear boundary extending in X-direction.

Accordingly, the spacing between adjacent display modules 110 is to be adjusted in the process of mounting the display module group 100 to arrange the display modules in a matrix as shown in FIG. 1. However, each display module 110 is large, and has a width of 2 m or greater in X-direction, a height of 1.5 m or greater in Y-direction, and a weight of 100 kg or greater. Finely adjusting the spacings GX and GY between adjacent display modules 110 to make the boundaries between the display modules unviewable is difficult. When the display modules 110 are shifted to adjust the spacings GX and GY, the display modules 110 can gain momentum to excessively move.

The display device 600 according to the present embodiment thus has a mechanism for facilitating adjustment of the spacing between adjacent display modules 110. The mechanism is described below in detail.

Figure 7:
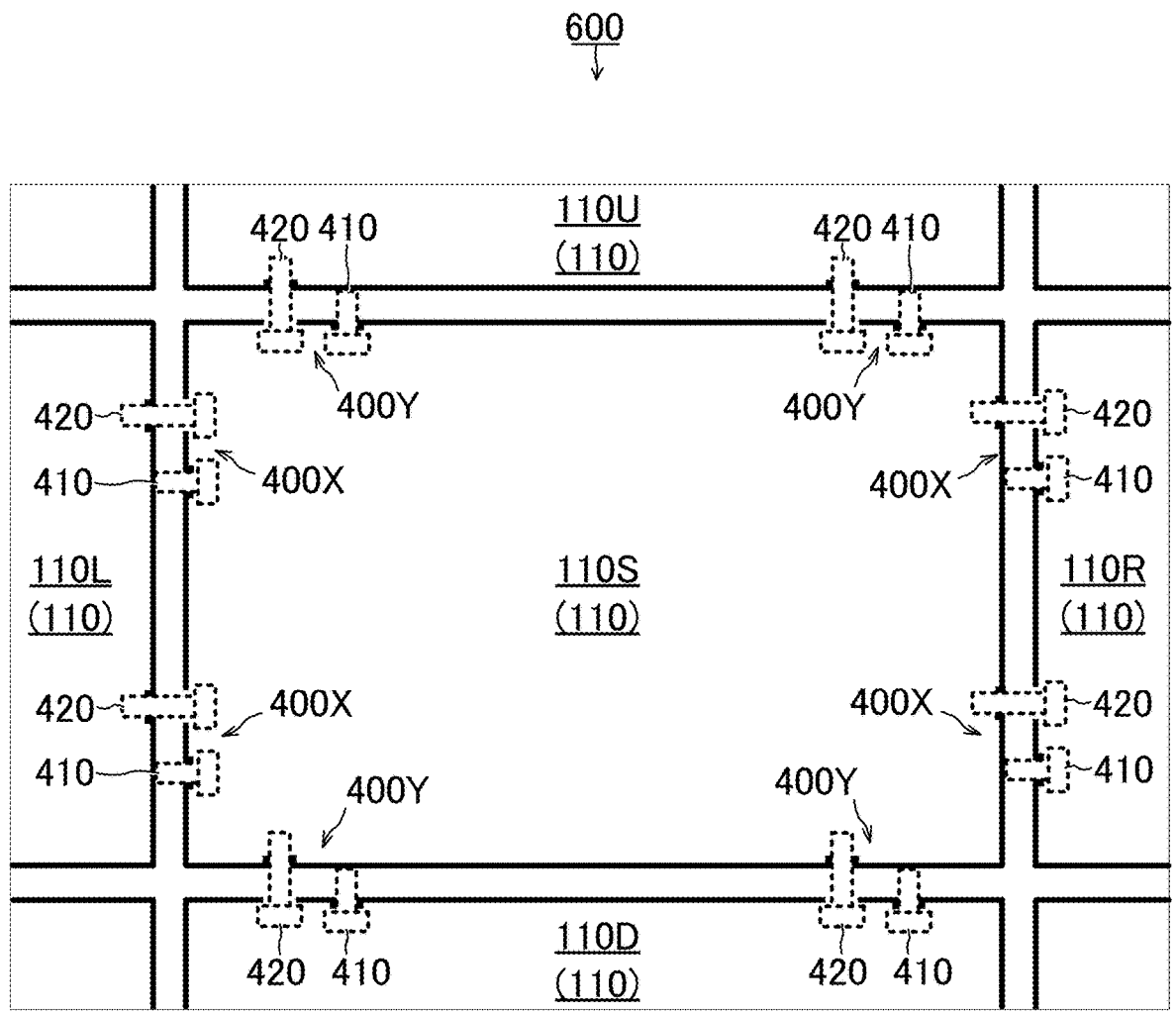
FIG. 7 is a schematic diagram illustrating an aspect of attachment of X-spacing adjusters and Y-spacing adjusters according to Embodiment 1.

FIG. 7 is an enlarged view of a display module 110S as a first display module and display modules 110U, 110D, 110R, and 110L as second display modules included in the display module group 100 shown in FIG. 1. The display module 110S serves as any element of the matrix (excluding the elements in the two outermost rows in Y-direction and the two outermost columns in X-direction). The display modules 110U, 110D, 110R, and 110L are adjacent to the first display module 110S. The display modules 110U and 110D are adjacent to the display module 110S in Y-direction. The display modules 110R and 110L are adjacent to the display module 110S in X-direction.

The display device 600 includes X-spacing adjusters 400X located between display modules 110 adjacent to each other in X-direction, and Y-spacing adjusters 400Y located between display modules 110 adjacent to each other in Y-direction.

The X-spacing adjusters 400X, more specifically, two, or upper and lower X-spacing adjusters 400X, are spaced from each other in Y-direction and are disposed between display modules 110 adjacent to each other in X-direction. The Y-spacing adjusters 400Y, or more specifically, two right and left Y-spacing adjusters 400Y, are spaced from each other in X-direction and are disposed between display modules 110 adjacent to each other in Y-direction.

The X-spacing adjusters 400X and the Y-spacing adjusters 400Y are each rotated to change, by a distance corresponding to the rotation angle, the spacing in which each of the adjusters is disposed. The X-spacing adjusters 400X and the Y-spacing adjusters 400Y have the same structure. One of the X-spacing adjuster 400X is described below in detail as a typical example.

Figure 8:
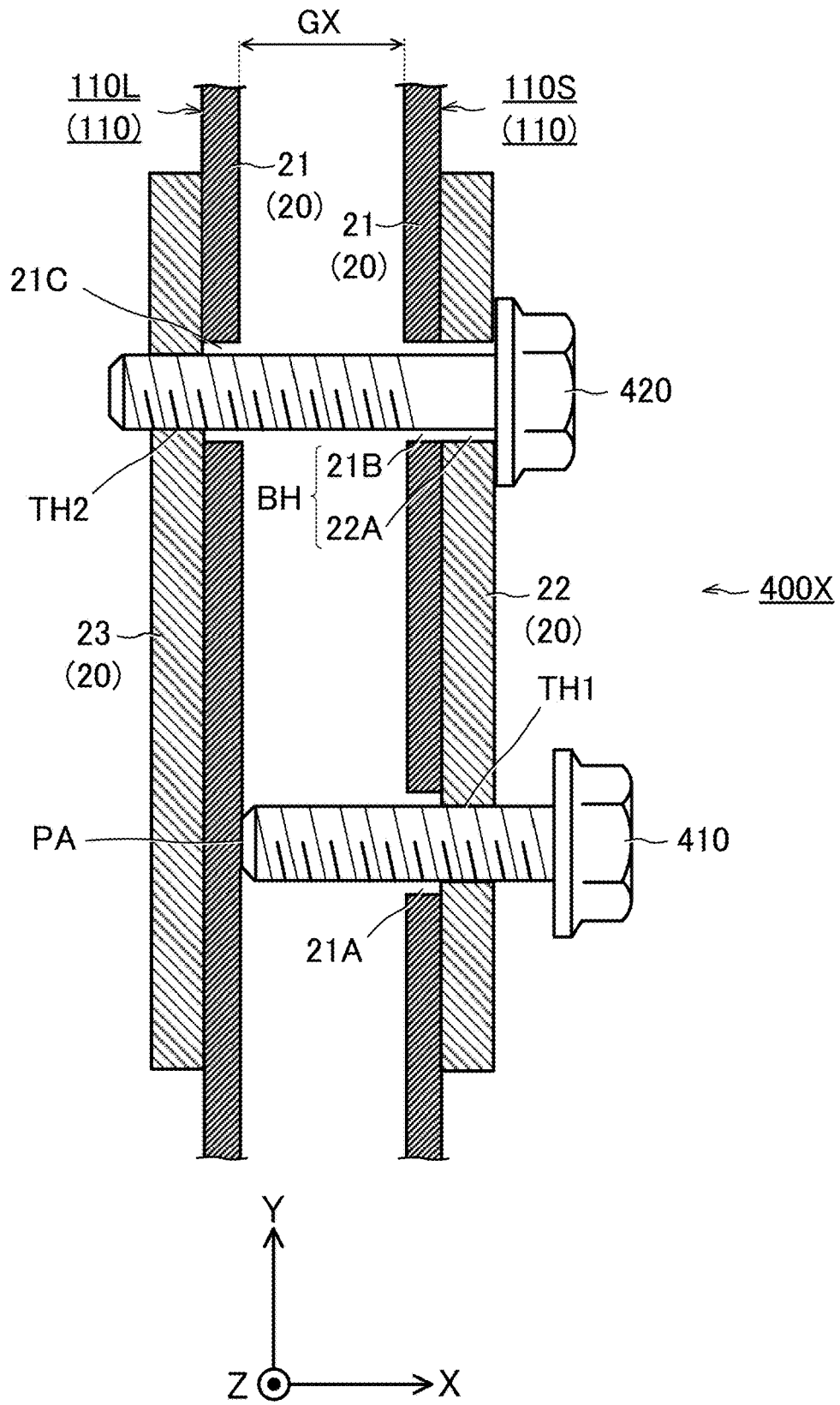
FIG. 8 is an enlarged partial cross-sectional view of an X-spacing adjuster according to Embodiment 1.

As shown in FIG. 8, the X-spacing adjuster 400X includes a first screw 410 and a second screw 420 both movable back and forth in X-direction. The first screw 410 and the second screw 420 are bolts. The first screw 410 and the second screw 420 are inserted in the same direction along X-axis, or more specifically inserted from right to left.

The first screw 410 is screwed through a first screw hole TH1 of display module 110S to cause the distal end of the first screw 410 to press against the adjacent display module 110L. As the first screw 410 is rotated clockwise, the first screw 410 is screwed out of the first screw hole TH1 toward the adjacent display module 110L by the length corresponding to the rotation angle. The spacing GX is thus expanded by the distance corresponding to the rotation angle of the first screw 410.

As the first screw 410 is rotated counterclockwise, the first screw 410 retreats away from the adjacent display module 110L by the length corresponding to the rotation angle. When there exists a gap between the distal end of the first screw 410 and the adjacent display module 110L, the second screw 420 can decrease the spacing GX by the length corresponding to the gap.

The second screw 420 is inserted through a through-hole BH of the display module 110S and screwed through a second screw hole TH2 of the adjacent display module 110L. The second screw 420 has an outer shank having a diameter smaller than the inner diameter of the through-hole BH, and has an outer head having a diameter greater than the inner diameter of the through-hole BH. The shank herein refers to a rod-shaped threaded portion. The head herein refers to a portion to be rotated with a tool.

As the second screw 420 is rotated clockwise, the head of the second screw 420 moves toward the second screw hole TH2 by the distance corresponding to the rotation angle. The spacing GX is thus decreased by the distance corresponding to the rotation angle of the second screw 420.

As the second screw 420 is rotated counterclockwise, the second screw 420 retreats away from the adjacent display module 110L by the length corresponding to the rotation angle. When there exists a gap between the head of the second screw 420 and the display module 110S, the first screw 410 can increase the spacing GX by the length corresponding to the gap.

The areas of the pair of display modules 110S and 110L through which the first screw 410 and the second screw 420 are put will now be described.

The housing 20 of the display module 110S includes a body 21 surrounding the display units 10 shown in FIG. 2. The portions of the body 21 through which the first screw 410 and the second screw 420 are put are reinforced with a first reinforcing plate 22. The first reinforcing plate 22 is joined locally to an inner surface portion of the body 21 facing the display units 10 shown in FIG. 2.

The housing 20 of the display module 110L includes a body 21 surrounding the display units 10 shown in FIG. 2. The portions of the body 21 against which the first screw 410 is pressed and through which the second screw 420 passes are reinforced with a second reinforcing plate 23. The second reinforcing plate 23 is joined locally to an inner surface portion of the body 21 facing the display units 10 shown in FIG. 2.

Although FIG. 8 partially shows the left side of the display module 110S and the right side of the display module 110L, the right side of the display module 110S (not shown) has the same structure as the right side of the display module 110L, and the left side of the display module 110L (not shown) has the same structure as the left side of the display module 110S. Thus, the housing 20 for each display module 110 includes the body 21, the first reinforcing plates 22, and the second reinforcing plates 23.

The body 21, the first reinforcing plate 22, and the second reinforcing plate 23 are formed from metal plates, or more specifically iron plates. The first reinforcing plate 22 and the second reinforcing plate 23 are thicker than the body 21. The first reinforcing plate 22 and the second reinforcing plate 23 are twice or more than twice as thick as the body 21. More specifically, the body 21 has a thickness of 2 mm or smaller, and the first reinforcing plate 22 and the second reinforcing plate 23 each have a thickness of 4 mm or greater.

The first screw hole TH1 is formed in the first reinforcing plate 22. The body 21 has a through-hole 21A communicating with the first screw hole TH1. The through-hole 21A has an inner diameter greater than the outer diameter of the shank of the first screw 410.

The through-hole BH includes a through-hole 22A formed in the first reinforcing plate 22 and a through-hole 21B formed in the body 21 communicating with each other.

The second screw hole TH2 is formed in the second reinforcing plate 23. The second reinforcing plate 23 covers an inner surface portion of the body 21, and the inner surface portion of the body 21 is opposite to a press receiving area PA against which the first screw 410 is pressed. The body 21 has a through-hole 21C communicating with the second screw hole TH2. The through-hole 21C has an inner diameter greater than the outer diameter of the shank of the second screw 420.

The Y-spacing adjusters 400Y shown in FIG. 7 have the same structure as the structure of the X-spacing adjuster 400X described above. More specifically, as shown in FIG. 7, each Y-spacing adjuster 400Y includes a first screw 410 and a second screw 420 both movable back and forth in Y-direction between display modules 110 adjacent to each other in Y-direction.

The first screw 410 and the second screw 420 included in each Y-spacing adjuster 400Y are both inserted upward from below. The housing 20 of each display module 110 thus has an upper side with the same structure as a right side of the display module 110L shown in FIG. 8, and has a lower side with the same structure as a left side of the display module 110S shown in FIG. 8.

The appearance of a portion of each display module 110 to receive the X-spacing adjusters 400X and the Y-spacing adjusters 400Y will now be described with reference to FIGS. 9A to 9D.

Figure 9A:
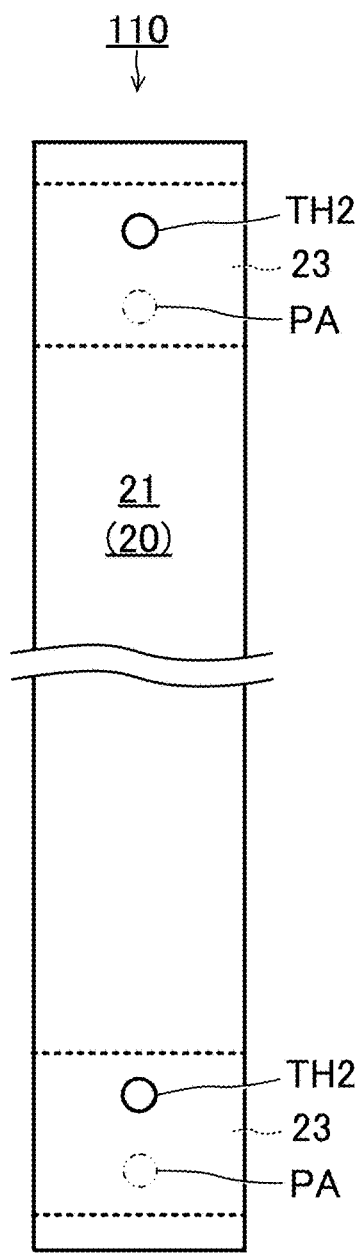
FIG. 9A is a right side view of the display module according to Embodiment 1.

As shown in FIG. 9A, one display module 110 has two, or upper and lower second screw holes TH2 for each receiving the second screw 420 of the X-spacing adjuster 400X and the upper and lower screw holes TH2 are formed on the right side surface. The press receiving areas PA indicated by two-dot chain lines, which are each located below the corresponding second screw hole TH2, receive a press from the distal end of the first screw 410 of the X-spacing adjuster 400X.

Figure 9B:
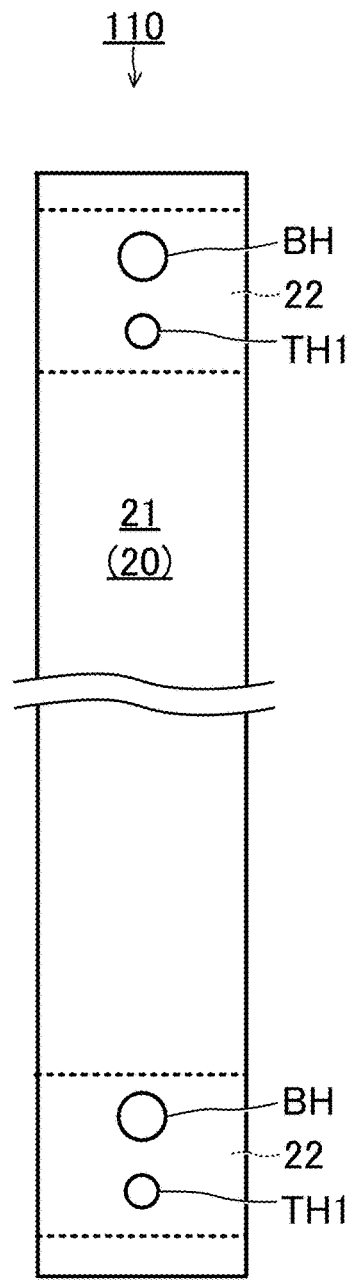
FIG. 9B is a left side view of the display module according to Embodiment 1.
Figure 9B:
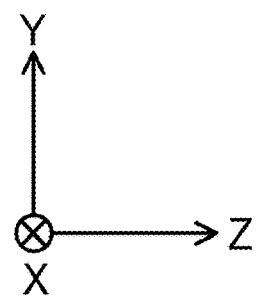

As shown in FIG. 9B, one display module 110 has two, or upper and lower sets of through-holes BH and first screw holes TH1 and the upper and lower sets of through-holes BH and first screw holes TH1 are formed on the left side surface. Each through-hole BH receives the second screw 420 of the X-spacing adjuster 400X, and each first screw hole TH1 receives the first screw 410 of the X-spacing adjuster 400X. As in FIG. 3, the first screws 410 and the second screws 420 protrude from the left side surface of the display module 110.

Figure 9C:
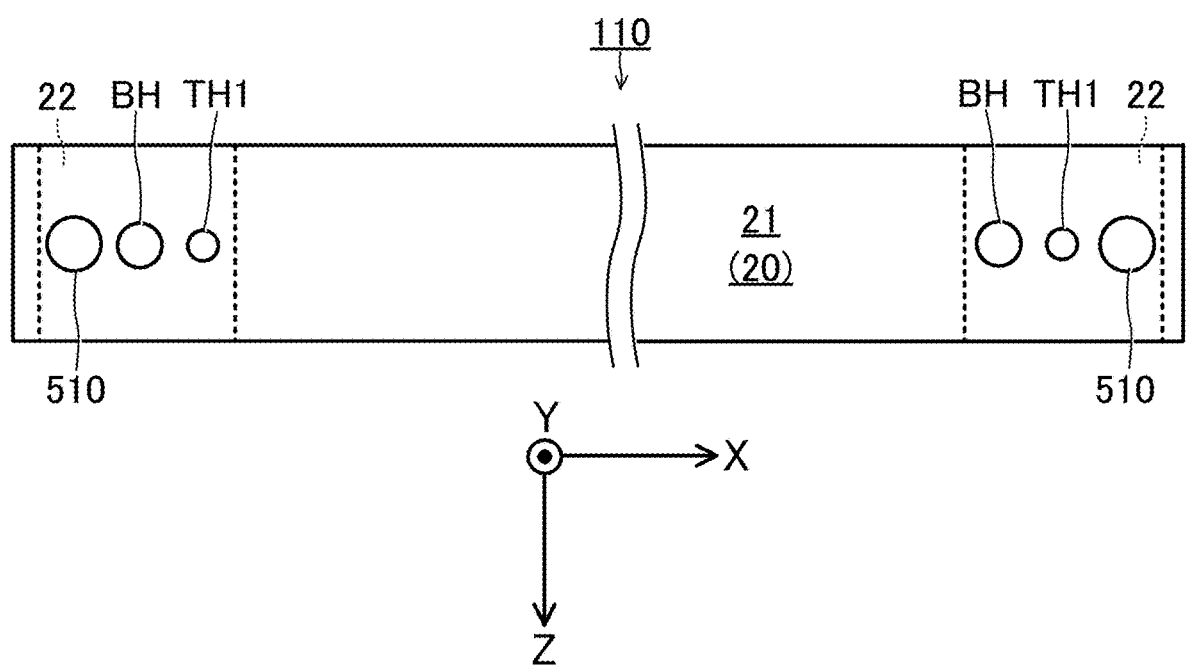
FIG. 9C is a plan view of the display module according to Embodiment 1.

As shown in FIG. 9C, one display module 110 has two, or right and left sets of through-holes BH and first screw holes TH1 and the right and left sets of through-holes BH and first screw holes TH1 are formed on the upper side surface. Each through-hole BH receives the second screw 420 of the Y-spacing adjuster 400Y, and each first screw hole TH1 receives the first screw 410 of the Y-spacing adjuster 400Y. As in FIG. 3, the first screws 410 and the second screws 420 protrude from the upper side surface of the display module 110.

Figure 9D:
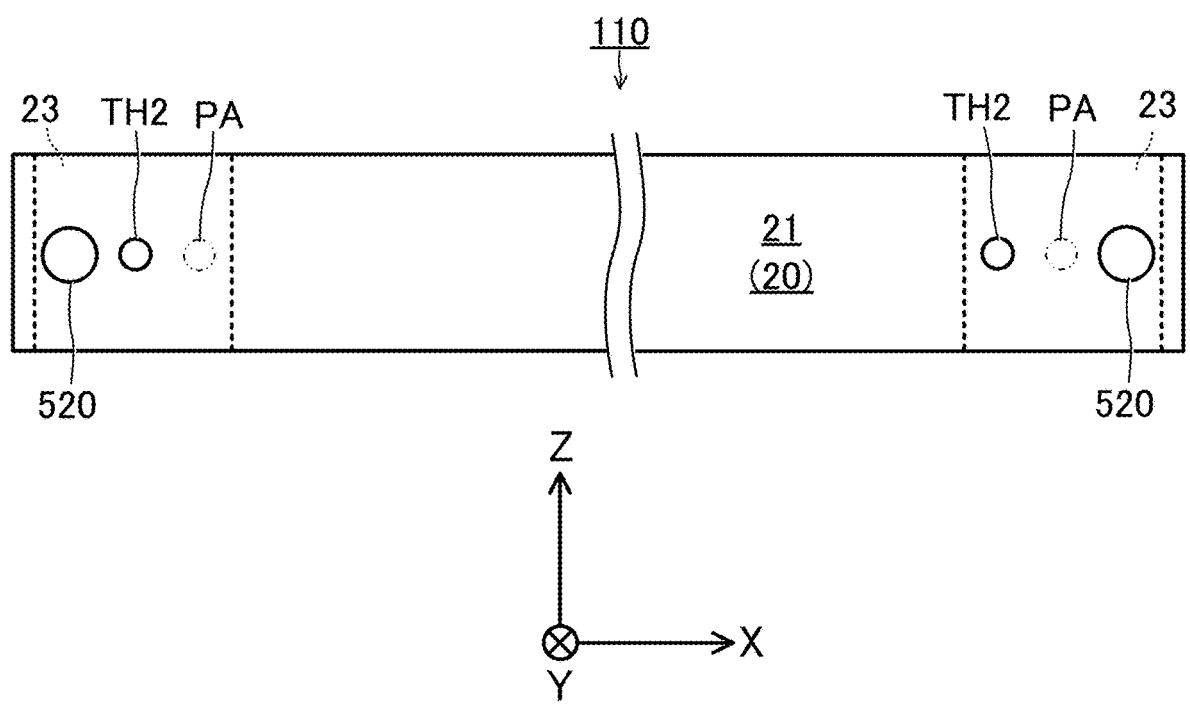
FIG. 9D is a bottom view of the display module according to Embodiment 1.

As shown in FIG. 9D, one display module 110 has two, or right and left second screw holes TH2 for each receiving the second screw 420 of the Y-spacing adjuster 400Y and the right and left second screw holes TH2 are formed on the lower side surface. The press receiving areas PA indicated by two-dot chain lines, which are each located on the lateral side of the corresponding second screw hole TH2, receive a press from the distal end of the first screw 410 of the Y-spacing adjuster 400Y.

The display module 110 according to the present embodiment also has a mechanism for facilitating positioning of display modules 110 stacked on other display modules 110 previously mounted in the frame 200 shown in FIG. 1. The mechanism is described below.

Figure 10:
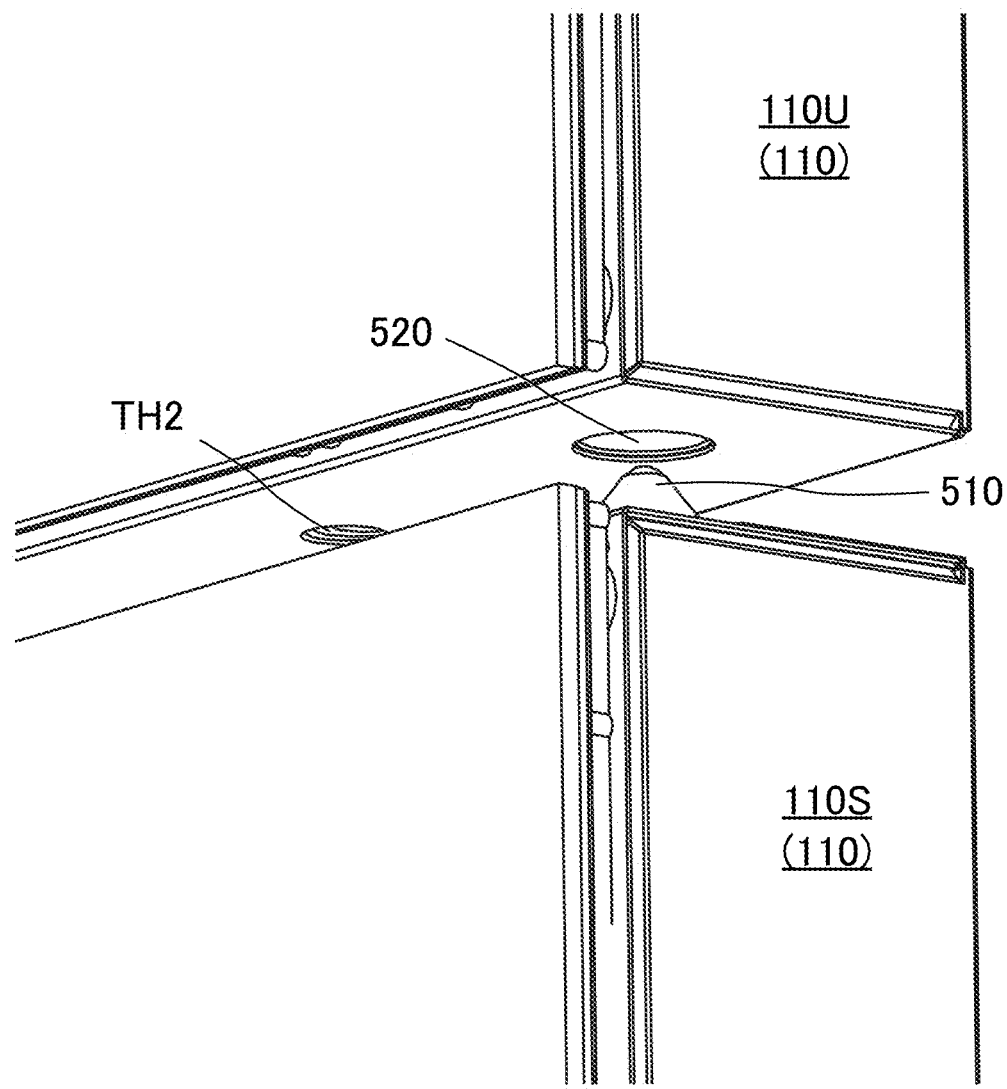
FIG. 10 is a perspective view of a pin and a fitting hole according to Embodiment 1.

As shown in FIG. 10, each display module 110 has pins 510 on the upper side. The pins 510 protrude toward another display module 110 are stacked on the display module 110 having the pins 50.

Each pin 510 tapers toward its tip to be cone-shaped as also shown in FIG. 3. In FIG. 9C, one display module 110 has pins 510 formed on regions of the upper side surface, or specifically two, right and left pins 510.

As shown in FIG. 10, each display module 110 also has fitting holes 520 on the bottom and the pins 510 of another display module 110 located below are fitted into the corresponding fitting holes 520. One display module 110 has two, or right and left fitting holes 520 on the bottom as shown in FIG. 9D in correspondence with the two, or right and left pins 510 on the upper side.

The pins 510 taper toward their tips. Thus, even if one display module 110 is slightly misaligned with another display module 110 on the XZ plane when the display module 110 is stacked on the other display module 110 already fixed, the pins 510 are fitted into the corresponding fitting holes 520 as the inner surface of the fitting hole 520 is guided by the outer surface of each pin 510. Each display module 110 stacked on another display module 110 is thus roughly positioned relative to the other display module 110.

The opening diameter of each fitting hole 520 is greater than the outer diameter of the basal end of the pin 510 to be fitted in the fitting hole 520. In this structure, each display module 110 can be shifted relative to the other display module 110 in X-direction as well as in Y-direction with the pins 510 of the other display module 110 fitted into the fitting holes 520 of the display module 110.

Each display module 110 stacked on another display module 110 can be shifted relatively in X-direction and Y-direction using the X-spacing adjusters 400X and the Y-spacing adjusters 400Y described above together with the temporary fastening enabled by the first brackets 310 and the second brackets 320 described above.

A method for producing the display device 600 described above will now be described. Under the condition that the frame 200 as shown in FIG. 1 is already incorporated into the display device 600, a process for mounting the display module group 100 is described below. A process of arranging the display module group 100 in a matrix is described in detail.

One of the display modules 110 to be in the bottom row of the matrix formed by the display module group 100 is first disposed on the base member 230 shown in FIG. 4. The display module 100 is then fixed to the beams 210 with the first brackets 310 and the second brackets 320 shown in FIG. 4.

Another display module 110 is then placed adjacent to the fixed display module 110 on the base member 230 in X-direction. The other display module 110 placed on the base member is temporarily fastened to the beams 210 with the first brackets 310 and the second brackets 320. As described above, the term, "temporary fastening", refers to attaching the display module 110 to the beams 210 with shifting of the display modules tolerated.

The X-spacing adjusters 400X shown in FIG. 7 are then placed between the temporarily fastened display module 110 and the display module 110 already fixed and adjacent to the temporarily fastened display module 110. In other words, the first screw 410 and the second screw 420 shown in FIG. 8 are put through one of the temporarily fastened display module 110 and the display module 110 already fixed and then through the other display module.

The spacing in X-direction between the temporarily fastened display module 110 and the fixed display module 110 is then adjusted by the X-spacing adjusters 400X. The X-spacing adjusters 400X are rotated to shift the temporarily fastened display module 110 relative to the fixed display module 110 in X-direction.

After the spacing in X-direction is adjusted, the temporarily fastened display module 110 is fixed to the beams 210. In other words, the bolts and the nuts connecting the first brackets 310 and the second brackets 320 to the beams 210 are tightened with a torque large enough to restrict shifting of the display module 110.

Further another display module 110 is then placed adjacent to the fixed other display module 110 in X-direction. The same procedure is repeated subsequently. In this manner, all the display modules 110 to be in the bottom row of the matrix are arranged on the frame 200. After the display modules in the bottom row are all mounted, the base member 230 shown in FIG. 4 may be removed.

Subsequently, one of the display modules 110 to be in the row immediately above the bottom row, which is the second row from the bottom row, is stacked on one of the display modules 110 in the bottom row that are already fixed. When the display module 110 is stacked on the other display module 110 in the bottom row, the fitting holes 520 in the display module 110 shown in FIG. 10 receive the pins 510 on the other display module 110 in the bottom row shown in FIG. 10. This roughly positions the display module 110 stacked on the other display module 110 in the bottom row.

The roughly positioned display module 110 is then temporarily fastened to the beams 210 with the first brackets 310 and the second brackets 320. The Y-spacing adjusters 400Y shown in FIG. 7 are then placed between the temporarily fastened display module 110 and the display module 110 located below and already fixed.

The spacing in Y-direction between the temporarily fastened display module 110 and the display module 110 located below is adjusted by the Y-spacing adjusters 400Y. After the adjustment is complete, the temporarily fastened display module 110 is fixed to the beams 210.

Another display module 110 is further temporarily fastened adjacent to the fixed display module 110 in X-direction. The X-spacing adjusters 400X are then placed between the temporarily fastened display module 110 and the already fixed display module 110 adjacent to temporarily fastened display module 110 in X-direction, and the Y-spacing adjusters 400Y are placed between the temporarily fastened display module 110 and the already fixed display module 110 located below.

The spacing in Y-direction between the temporarily fastened display module 110 and the display module 110 located below is adjusted by the Y-spacing adjusters 400Y, and the spacing in X-direction between the temporarily fastened display module 110 and the adjacent display module 110 in X-direction is adjusted by the X-spacing adjusters 400X. After the adjustment is complete, the temporarily fastened display module 110 is fixed to the beams 210.

The same procedure is repeated subsequently to arrange all the display module 110 to be in the second row from the bottom row. The same procedure is further repeated subsequently to mount all the display module 110 to be in the third row from the bottom row.

As described above, the arrangement process includes (i) the spacing adjustment process including a step of temporarily fastening another display module 110 to a display module 110 already fixed to the frame 200 and a step of adjusting a spacing between the display module 110 already fixed to the frame 200 and the display module 110 temporarily fastened adjacent to the fixed display module 110 and (ii) the fixing process including a step of fixing the temporarily fastened display module 110 to the frame 200. These processes are repeated to mount the display module group 100 to arrange the display modules in a matrix from the bottom row to the top row.

When display modules 110 are to be arranged all in each row of the matrix, one display module 110 located in the middle of the row rather than the two outermost ends of the row may be preferably first fixed to the beams 210. In this case, other display modules 110 can be arranged on both right and left sides of the first fixed display module 110 in parallel and at the same time, thereby enabling the display modules 110 to be efficiently arranged in the row.

In the present embodiment described above, the X-spacing adjusters 400X are rotated to change the spacing GX between display modules 110 adjacent to each other in X-direction by the distance corresponding to the rotation angle. The Y-spacing adjusters 400Y are also rotated to change the spacing GY between display modules 110 adjacent to each other in Y-direction by the distance corresponding to the rotation angle. The display modules 110 are shifted by rotating the X-spacing adjusters 400X and the Y-spacing adjusters 400Y, thereby hindering the display modules 110 from gaining momentum to excessively move. This facilitates adjustment of the spacing between adjacent display modules 110.

As shown in FIG. 7, two X-spacing adjusters 400X spaced from each other in Y-direction are located between each pair of display modules 110 adjacent to each other in X-direction, and two Y-spacing adjusters 400Y spaced from each other in X-direction are located between each pair of display modules 110 adjacent to each other in Y-direction. In other words, each pair of adjacent display modules 110 have two sets of first screw holes TH1, second screw holes TH2, and through-holes BH with the two sets spaced from each other in a direction perpendicular to the direction in which the display modules of the pair of display modules 110 face each other, as the display screen SC is viewed from the front. This structure also regulates the rotation of each display module 110 performed on the XY plane.

Embodiment 2

At least one of the first screw 410, the second screw 420, the first screw hole TH1, the second screw hole TH2, and the through-hole BH may be used for attaching, to the display module 110, a transport fixture to be used for transporting the display module 110. The transport fixture herein refers to a member for facilitating transportation. A specific example is described below.

Figure 11:
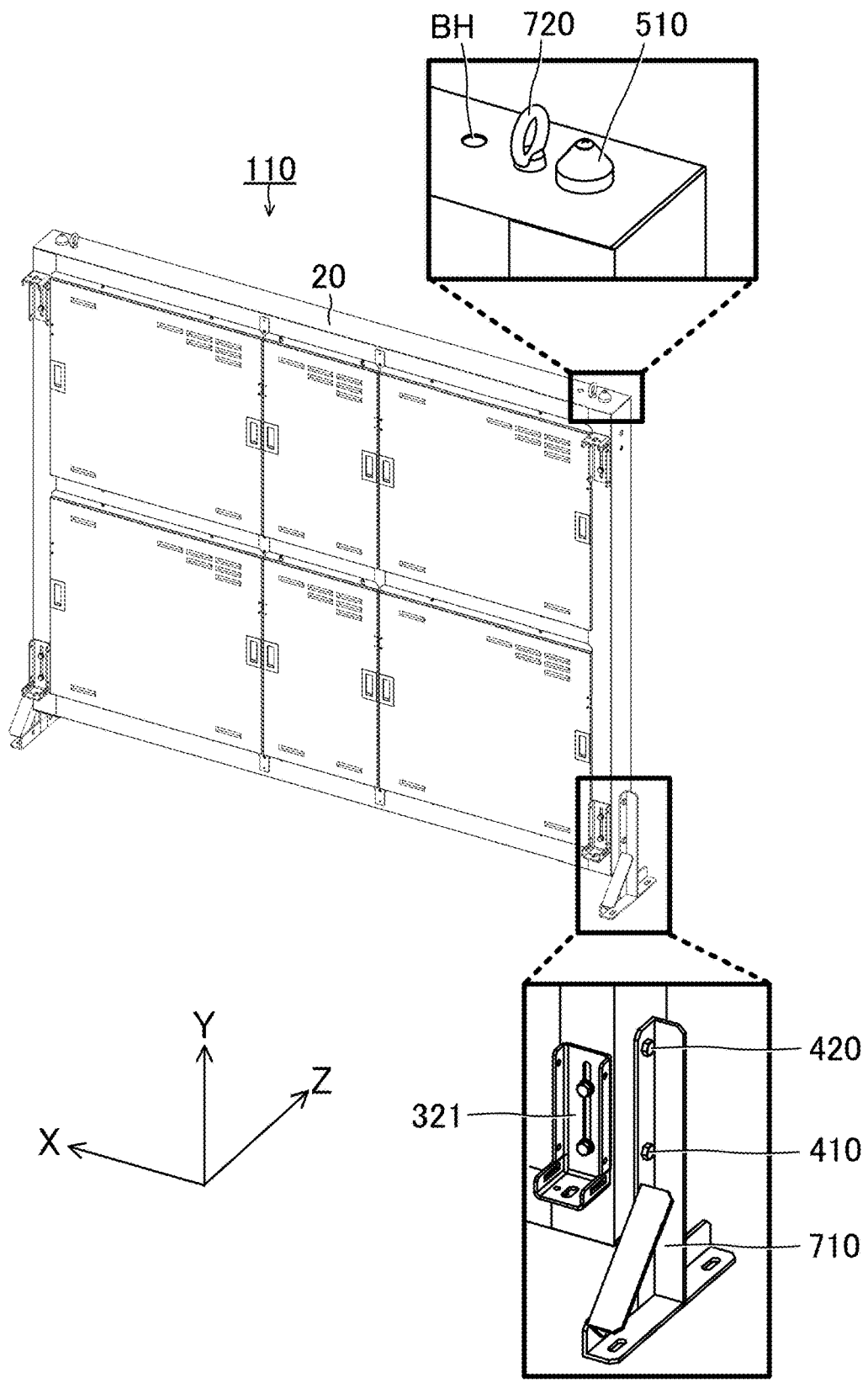
FIG. 11 is a perspective view of a display module according to Embodiment 2 during transportation.

In the present embodiment, as shown in FIG. 11, each display module 110 has stands 710 as transport fixtures for supporting the display module 110 with the display module 110 in a vertical position. The stands 710 are attached to the lower ends of the right-side and left-side surfaces of the display module 110 using the first screws 410 and the second screws 420 described above.

Each first screw 410 penetrates through the corresponding stand 710 and screwed into the lower first screw hole TH1 shown in FIG. 9B in the positive X-direction. Each second screw 420 penetrates through the stand 710 and the lower through-hole BH shown in FIG. 9B and screwed into the nut (not shown) located inside the housing 20 in the positive X-direction.

Since the stands 710 is attached to the display module 110, the display module 110 can be temporarily placed at an intended site during transportation. Since the stands 710 supports the display module 110 with the display module 110 in the vertical position, the display module 110 can be temporarily placed without contact between the front surface receiving the light emitting devices 11 shown in FIG. 6 and the floor or ground.

The display module 110 can have eyebolts 720 attached to the upper-side surface as transport fixtures for hanging the display module 110. The eyebolts 720 are attached to the right and left ends of the upper-side surface of the display module 110. Each eyebolt 720 is screwed into the first screw hole TH1 shown in FIG. 9C in the negative Y-direction.

The eyebolts 720 functioning as metal hanging hooks are attached to the display module 110. The display module 110 can thus be transported with a crane, for example, when the display module 32 as a cargo is loaded into a vehicle or mounted onto the frame 200 shown in FIG. 1.

Figure 12:
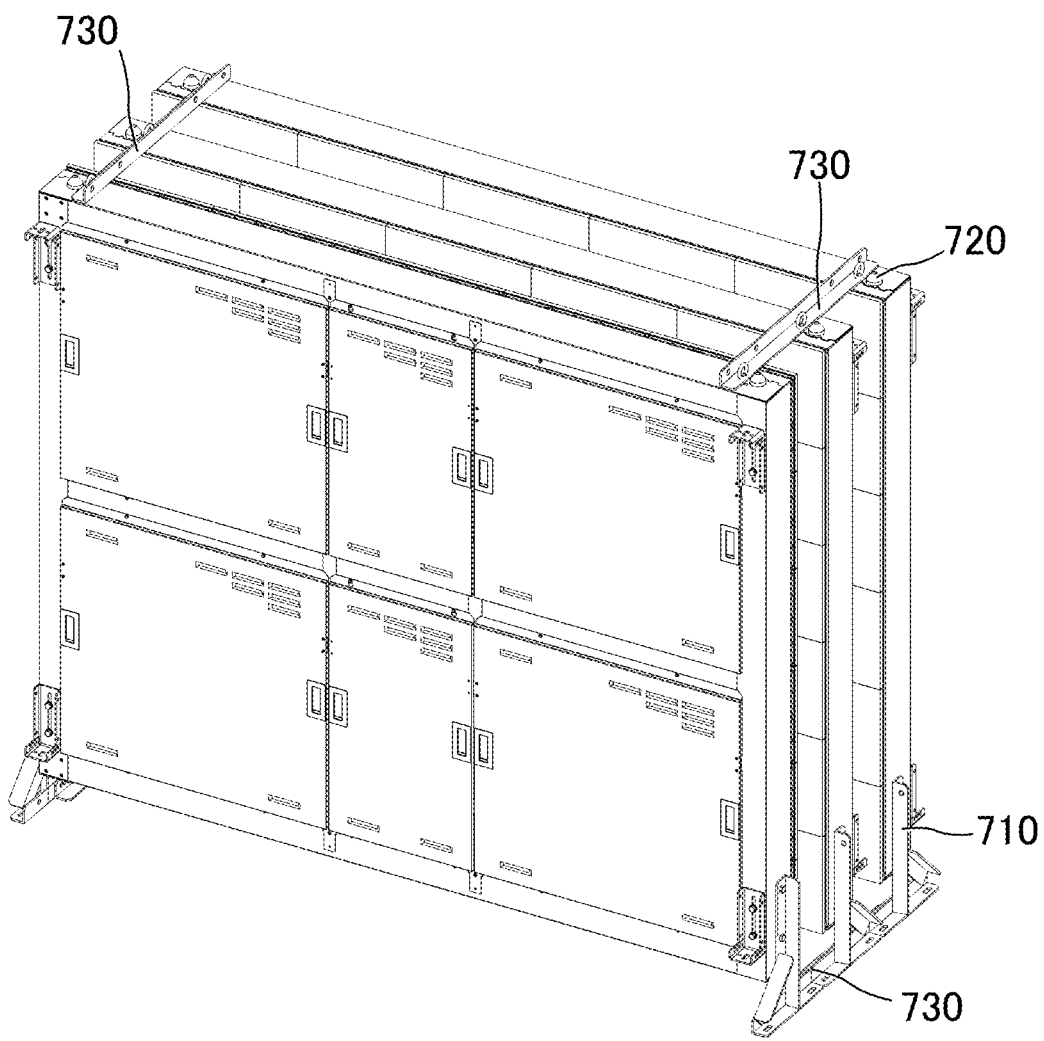
FIG. 12 is a perspective view of display modules according to Embodiment 2 during transportation.

As shown in FIG. 12, the display modules 110 may be connected together with connectors 730. As a result, the connected display modules 110 can be transported together. The transport fixtures for facilitating transportation include the connectors 730.

On the upper-side surface of each display module 110, the eyebolts 720 are put through the connectors 730 and then screwed into the display module 110. The eyebolts 720 are also used for attaching the connectors 730. The connectors 730 extend across the stands 710 and connect the stands 710 together.

The front surfaces of the three display modules 110 connected together are provided with the light emitting devices 11 shown in FIG. 6 and are arranged parallel to one another. The two outermost display modules 110 in the direction in which the display modules 110 are arranged have the front surfaces facing inward. In other words, the two outermost display modules 110 have the rear surfaces facing outward. Accordingly, the display modules 110 can be transported without contact between the front surfaces and other parts during transportation.

Figure 13:
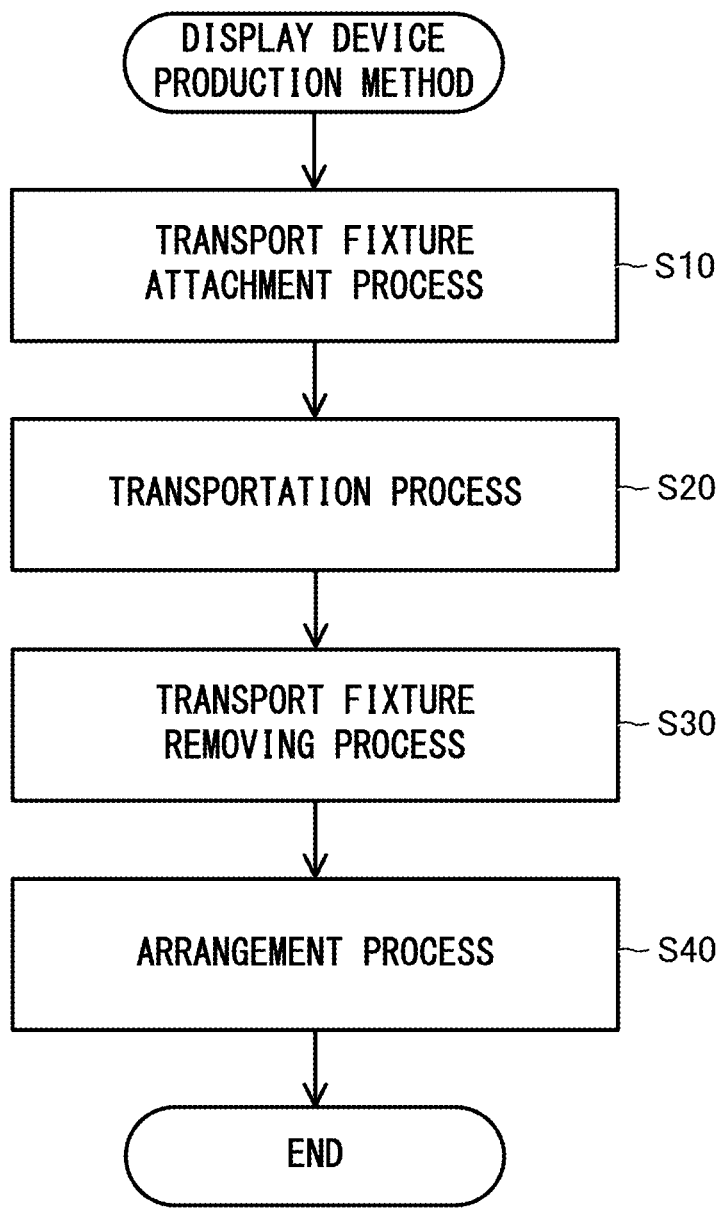
FIG. 13 is a flowchart showing a display device production method according to Embodiment 2.

In the present embodiment, as shown in FIG. 13, the stands 710 and the eyebolts 720 as transport fixtures for transporting the display modules 110 are first attached to each display module 110 in the display module group 100. The display modules 110 are connected together with the connectors 730. This process is referred to as a transport fixture attachment process (step S10).

The display modules 110 with the stands 710, the eyebolts 720, and the connectors 730 attached as transport fixtures are then transported to an installation site of the frame 200 shown in FIG. 1. This process refers to a transportation process (step S20).

In an installation site, the stands 710, the eyebolts 720, and the connectors 730 as transport fixtures are removed from the display modules 110. At this point in time, the first screws 410 and the second screws 420 used to attach the stands 710 are also removed. This process is referred to as a transport fixture removing process (step S30). The eyebolts 720 may be removed after the display module 110 is placed on the frame 200.

The display module group 100 is mounted onto the frame 200 to arrange display modules 110 in a matrix while the spacing between adjacent display modules is being adjusted as described in Embodiment 1. As a result, the display module group 100 forms the display screen SC. This process is referred to as an arrangement process (step S40).

In the present embodiment, the stands 710, the eyebolts 720, and the connectors 730 are attached to the display modules 110, thereby facilitating transportation of the display modules 110.

The first screws 410 and the second screws 420 are used for attaching the stands 710, thereby reducing the number of components for facilitating transportation. The eyebolts 720 may be used as the first screws 410 of the Y-spacing adjusters 400Y to further reduce the number of components.

The first screw holes TH1 may be also used for attaching the stands 710 and the eyebolts 720 to the display module 110, in addition to the first screws 410 and the second screws 420. This simplifies the structure of the housing 20.

Embodiment 3

In Embodiments 1 and 2, the X-spacing adjusters 400X and the Y-spacing adjusters 400Y remain between adjacent display modules 110 after the display modules 110 are fixed to the frame 200. The X-spacing adjusters 400X and the Y-spacing adjusters 400Y may be removed after the display modules 110 are fixed to the frame 200. A specific example is described below.

Figure 14:
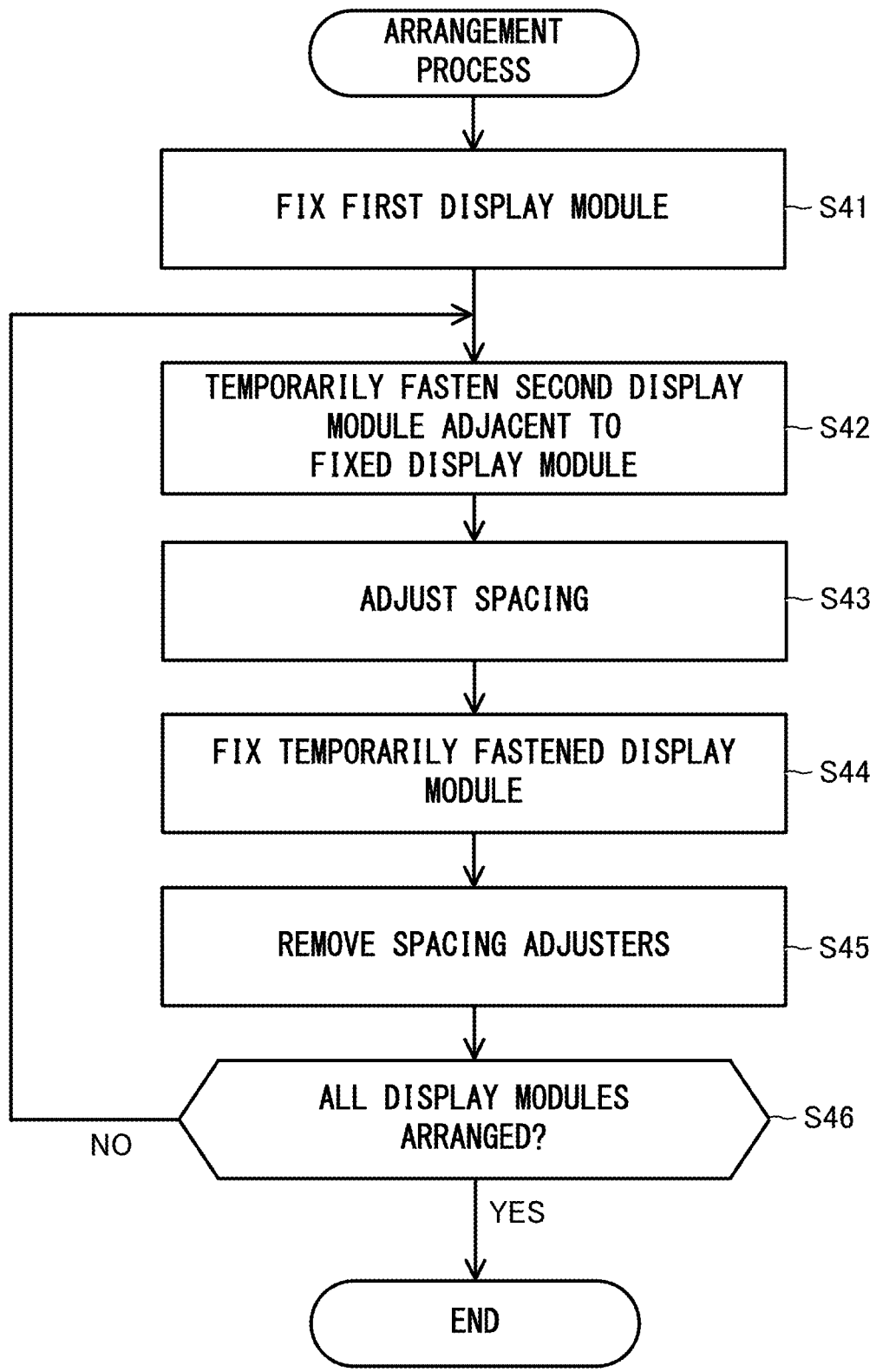
FIG. 14 is a flowchart showing an arrangement process according to Embodiment 3.

In the present embodiment, as shown in FIG. 14, the arrangement process in step S40 shown in FIG. 13 includes removing the X-spacing adjusters 400X and the Y-spacing adjusters 400Y (step S45). This step is described below in detail.

In the arrangement process, a first display module 110 is first fixed to the frame 200 (step S41). A second display module 110 is then temporarily fastened adjacent to the first display module 110 already fixed to the frame 200 (step S42). The spacing between these display modules 110 is adjusted using at least either the X-spacing adjusters 400X or the Y-spacing adjusters 400Y (step S43). The temporarily fastened display module 110 is then fixed to the frame 200 (step S44). The procedure of the present embodiment is the same as in Embodiment 1 so far.

In the present embodiment, the spacing adjusters are then removed (step S45). The spacing adjusters herein are referred to as adjusters used for adjusting the spacing in step S43. That is, when the X-spacing adjusters 400X and the Y-spacing adjusters 400Y are both used in step S43, both the adjusters are removed in step S45. When either the X-spacing adjusters 400X or the Y-spacing adjusters 400Y are used in step S43, the used adjustors alone are to be removed.

If all the display modules 110 are not yet arranged on the frame 200 (No in step S46), the processing returns to step S42. If all the display modules 110 are arranged on the frame 200 (Yes in step S46), the arrangement process ends.

In the present embodiment, the X-spacing adjusters 400X and the Y-spacing adjusters 400Y are removed. Thus, when the display device 600 is thermally deformed, adjacent display modules 110 can shift toward each other and away from each other while remaining fixed to the frame 200. The components of the display device 600 are can thus receive less stress, for example, immediately after the display device 600 is powered on or when the ambient temperature of the installed display device 600 changes suddenly.

In the present embodiment, the X-spacing adjusters 400X and the Y-spacing adjusters 400Y are removed after used to adjust the spacing during mounting of the display module group 100. However, even though all the X-spacing adjusters 400X and all the Y-spacing adjusters 400Y may be removed after all the display modules 110 are mounted, the same advantages are obtained. That is, the spacing adjusters used for adjusting the spacing between adjacent display modules 110 have only to be removed in parallel with or after the arrangement process.

Embodiment 4

In Embodiment 1, as shown in FIG. 8, the first screw 410 for shifting the adjacent display modules 110 away from each other is movable back and forth in the facing direction in which the display modules 110 face each other. However, a screw movable back and forth in a direction intersecting with the facing direction of the display modules 110 may be also used for shifting the display modules 110 away from each other. A specific example of this is described below.

Figure 15:
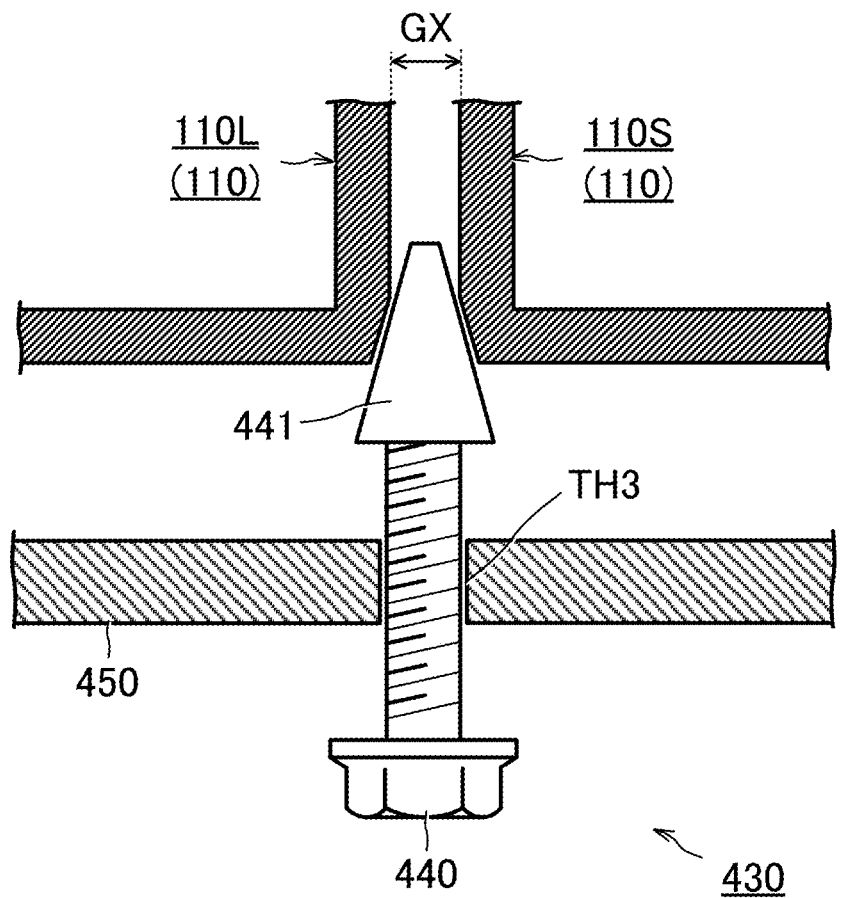
FIG. 15 is a schematic view of a main part of a spacing adjuster according to Embodiment 4.
Figure 15:
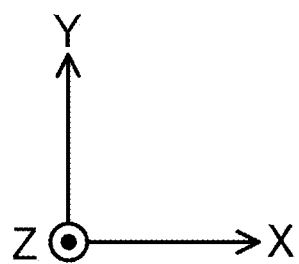

As shown in FIG. 15, an X-spacing adjuster 430 according to the present embodiment includes a screw 440 movable back and forth in Y-direction perpendicular to X-direction in which the adjacent display modules 110 face each other, and a slider 450 having a screw hole TH3 receiving the screw 440.

The screw 440 has a wedge 441 at the end of the threaded shank opposite to the head of the screw 440. The wedge 441 is shaped like a cone that is tapered toward its tip. The wedge 441 is placed between the adjacent display modules 110. The adjacent display modules 110 may preferably have chamfered portions that come into contact with the wedge 441.

The slider 450 is slidable in X-direction along the frame 200 shown in FIG. 1 and can be fixed to the frame 200 at an intended position in X-direction. When the slider 450 is fixed to the frame 200, the slider 450 cannot slide freely in Y-direction. The slider 450 is fixed to the frame 200 with bolts and nuts (not shown).

A way of using the X-spacing adjuster 430 is described below. The slider 450 is first positioned to have the tip of the wedge 441 located on the boundary between the adjacent display modules 110. The slider 450 is then fixed to the frame 200.

As the screw 440 is rotated, the wedge 441 moves in the positive Y-direction while the spacing GX between the display modules 110 adjacent to each other in X-direction is being increased. Thus, this expands the spacing GX.

In the same manner as with the X-spacing adjuster 400X shown in FIG. 8, the X-spacing adjuster 430 according to the present embodiment is also placed between the adjacent display modules 110S and 110L in the frame 200, and is rotated to change the spacing GX between the adjacent display modules 110S and 110L by the distance corresponding to the rotation angle.

The slider 450 and the screw 440 may be attached to the frame 200 to make the slider 450 slidable in Y-direction and the screw 440 movable back and forth in X-direction. In this case, the slider 450 and the screw 440 form a Y-spacing adjuster for increasing the spacing GY between the display modules 110 adjacent to each other in Y-direction.

Although the embodiments of the present disclosure have been described above, the present disclosure is not limited to the above embodiments. The present disclosure may be modified as described below.

In the above embodiments, the spacing between the display modules 110 is adjusted with the X-spacing adjusters 400X and the Y-spacing adjusters 400Y. However, with respect to the display modules 110 located in the two outermost columns in a direction along the rows and the two outermost rows in a direction along the columns of the matrix of the display module group 100, the spacing between each of such display modules 110 and the frame 200 may be adjusted with the X-spacing adjusters 400X or the Y-spacing adjusters 400Y. In this case, the post structures 220 and the base member 230 included in the frame 200 have at least one of the first screw holes TH1, the second screw holes TH2, the through-holes BH, and the press receiving areas PA.

When the display screen SC is viewed from the front, display modules 110 in the bottom row of the matrix may particularly have the first screw holes TH1 receiving the first screws 410 to be pressed against the base member 230 on which the display modules 110 are placed. In another case, these display modules 110 may have the press receiving areas PA against which the first screws 410 screwed into the first screw holes TH1 of the base member 230 are pressed.

In the above embodiments, although the first screws 410 and the second screws 420 are movable back and forth in a direction parallel to the XY plane, at least either the first screws 410 or the second screws 420 inserted to be movable back and forth in Z-direction may be used to adjust the positions of the display modules 110 in Z-direction relative to the frame 200. In this case, the post structures 220 and the base member 230 included in the frame 200 also have at least one of the first screw holes TH1, the second screw holes TH2, the through-holes BH, and the press receiving areas PA.

As described above, the display device 600 may further include frame-spacing adjusters (not shown) located between the frame 200 and the display modules 110 and rotated to change the spacing between the frame 200 and each display module 110 by the distance corresponding to the rotation angle. The frame-spacing adjusters may be used for adjusting the spacing in X-direction, the spacing in Y-direction, or the spacing in Z-direction between the frame 200 and each display module 110. Frame-spacing adjusters for adjusting the spacing in Z-direction is placed between one display module 110 and the frame 200, thereby facilitating adjustment of the angle of inclination of the display module 110 with respect to the XY plane.

In the above embodiments, the X-spacing adjusters 400X and the Y-spacing adjusters 400Y have the capabilities of shifting adjacent display modules 110 away from each other and shifting the adjacent display module 110 toward each other. The adjusters may have only either of the capabilities. Even in a case in which the X-spacing adjusters 400X and Y-spacing adjusters 400Y each have only the capability of shifting adjacent display modules 110 away from each other, the adjacent display modules 110 may be once made to become sufficiently close to each other, and the spacing between the display modules 110 may then be gradually increased with the X-spacing adjusters 400X or the Y-spacing adjusters 400Y, thereby making the spacing between the display modules 110 closer to an optimum value. Also, even in a case in which the X-spacing adjusters 400X and Y-spacing adjusters 400Y each have only the capability of shifting adjacent display modules 110 toward each other, the adjacent display modules 110 may be once spaced sufficiently apart from each other, and the spacing between the display modules 110 may then be gradually decreased with the X-spacing adjusters 400X or the Y-spacing adjusters 400Y, thereby making the spacing between the display modules 110 closer to an optimum value.

In the above embodiments, both the X-spacing adjusters 400X and the Y-spacing adjusters 400Y are used for adjusting the spacing between adjacent display modules 110. When the spacing in X-direction or the spacing in Y-direction is not to be adjusted, either the X-spacing adjusters 400X or the Y-spacing adjusters 400Y may be used.

In the above embodiments, as shown in FIG. 8, the first screw holes TH1 are formed in the first reinforcing plates 22 attached to the body 21 and the second screw holes TH2 are formed in the second reinforcing plates 22 attached to the body 21. The first screw holes TH1 and the second screw holes TH2 may be formed in the display module 110 in another manner. The first screw holes TH1 and the second screw holes TH2 may be directly tapped into the body 21. Nuts with the first screw holes TH1 and nuts with the second screw holes TH2 may be welded to the body 21.

In the above embodiments, each of the display modules 110 includes the pins 510 on the upper side protruding upward. A display module among the display modules 110 may include pins protruding in the right-left direction on the side surfaces of the display module 110, and other display modules 110 adjacent to the display module 110 with the pins in the right-left direction may have fitting holes for receiving the pins.

In the above embodiments, the arrangement process includes (i) the spacing adjustment process for adjusting the spacing between the display module 110 already fixed to the frame 200 and the display module 110 temporarily fastened adjacent to the fixed display module 110 and (ii) the fixing process for fixing the temporarily fastened display module 110 to the frame 200, and the spacing adjustment process and the fixing process are repeated. However, after all the display modules 110 are once temporarily fastened to the frame 200, the spacing between adjacent display modules 110 may be adjusted. Also, after the spacing is adjusted between all adjacent display modules 110, all the display modules 110 may be fixed.

In the above embodiments, although display modules of the display module group 100 are arranged from the bottom row to the top row in the arrangement process, the display modules of the display module group 100 may be arranged from the top row to the bottom row. The display modules 110 may be arranged in any order.

Although the transport fixtures include the stands 710, the eyebolts 720, and the connectors 730 in one of the above embodiments, the transport fixtures are not limited to these parts. The transport fixtures may include handles attached to the display modules 110 for handling the display modules 110. In the specification, attaching a transport fixture to each display module 110 also means attaching a transport fixture to be used commonly for a set of multiple display modules 110.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The structure according to the present disclosure may be used in display devices for displaying an image. The structure according to the present disclosure facilitates adjustment of the spacing between large and heavy display modules, and may thus be suited to large-sized display devices larger than to home display devices. Large-sized display devices may be installed in, for example, stadiums, event sites, busy streets, public squares, and on the walls of buildings.

REFERENCE SIGNS LIST

10 Display unit
11 Light emitting device
12 Circuit board
20 Housing
21 Body
21A, 21B, 21C Through-hole
22 First reinforcing plate
22A Through-hole
30 Second reinforcing plate
100 Display module group
110 Display module
110S Display module (first display module)
110U, 110D, 110R, 110L Display module (second display module)
200 Frame
210 Beam
211 X-slot
220 Post structure
230 Base member
310 First bracket
311 Base
312 Protrusion
313 Y-slot
314 Bolt
315 Z-slot
320 Second bracket
321 Base
322 Protrusion
323 Y-slot
324 Bolt
325 Z-slot
400X X-spacing adjuster (spacing adjuster)
400Y Y-spacing adjuster (spacing adjuster)
410 First screw (screw)
420 Second screw (screw)
430 X-spacing adjuster (spacing adjuster)
440 Screw
441 Wedge
450 Slider
510 Pin
520 Fitting hole
600 Display device
710 Stand (transport fixture)
720 Eyebolt (transport fixture)
730 Connector (transport fixture)
SC Display screen
TH1 First screw hole
TH2 Second screw hole
TH3 Screw hole
BH Through-hole
PA Press receiving area
PX, PY Pitch
GX, PX' Spacing in X-direction
GY, PY' Spacing in Y-direction

The invention claimed is:
1. A display module group comprising:
display modules arranged in a matrix to form a display screen for displaying an image,
wherein
a first display module selected from among the display modules has a first screw hole into which a first screw is screwed with the first screw pressed against a second display module among the display modules in forming the display screen, the second display module being placed adjacent to the first display module,
one display module of the first display module and the second display module has a through-hole, and another display module of the first display module and the second display module has a second screw hole into which a second screw is screwed after the second screw is put through the through-hole toward the another display module, and
the second screw includes a shank having an outer diameter smaller than an inner diameter of the through-hole and a head having an outer diameter greater than the inner diameter of the through-hole.

2. The display module group according to claim 1, wherein
the first display module and the second display module that are paired with each other include sets of the first screw holes, the second screw holes, and the through-holes, the sets of the first screw holes, the second screw holes and the through-holes being spaced from one another in a direction intersecting with a direction in which the first display module and the second display module face each other as the display screen is viewed from a front.

3. The display module group according to claim 1, wherein
the second display module includes
a display module adjacent to the first display module in a direction along rows of the matrix formed by the display modules on the display screen, and
a display module adjacent to the first display module in a direction along columns of the matrix.

4. The display module group according to claim 1, wherein
one display module of the first display module and the second display module includes a pin protruding toward another display module of the first display module and the second display module and tapering toward a tip of the pin, and
the another display module has a fitting hole to receive the pin.

5. The display module group according to claim 1, further comprising:
the first screw;
the second screw; and
a stand attached to each of the display modules by the first screw and the second screw, the stand being configured to support each of the display modules in a vertical position.

6. A display device, comprising:
the display module group according to claim 1;
a frame receiving the display modules of the display module group that are arranged in a matrix; and
a fixture fixing to the frame the display modules of the display module group that are arranged in the matrix.

7. The display device according to claim 6, wherein
the fixture is configured to temporarily fasten the first display module and the second display module to the frame in a manner permitting relative shifting that changes a spacing between the first display module and the second display module, the first display module and the second display module being paired with each other and being selected from the display module group.

8. A display device comprising: display modules configured to each display an image; a frame receiving the display modules arranged in a matrix; a spacing adjuster located between and contacting adjacent display modules among the display modules in the frame, the spacing adjuster being configured to be rotated to change a spacing between the adjacent display modules by a distance corresponding to an angle of rotation; and a fixture fixing to the frame the display modules having the spacing between the adjacent display modules adjusted with the spacing adjuster wherein the spacing adjuster includes a wedge at a first end and a head at an opposite end.

* * * * *